US012757672B2

(12) United States Patent
Lee et al.

(10) Patent No.: US 12,757,672 B2
(45) Date of Patent: Oct. 6, 2026

(54) SUBSTRATE TREATING APPARATUS AND SUBSTRATE TREATING METHOD

(71) Applicant: SEMES CO., LTD., Cheonan-si (KR)

(72) Inventors: Young Hun Lee, Cheonan-si (KR); Do Hyeon Yoon, Cheonan-si (KR); Eun Seok Kim, Cheonan-si (KR)

(73) Assignee: Semes Co., LTD., Cheonan-si (KR)

(*) Notice: Subject to any disclaimer, the term of this patent is extended or adjusted under 35 U.S.C. 154(b) by 118 days.

(21) Appl. No.: 18/792,709

(22) Filed: Aug. 2, 2024

(65) Prior Publication Data

US 2025/0046631 A1 Feb. 6, 2025

(30) Foreign Application Priority Data

Aug. 3, 2023 (KR) ........................ 10-2023-0101639

(51) Int. Cl.
*H10P 72/00* (2026.01)
*H10P 72/30* (2026.01)

(52) U.S. Cl.
CPC ...... *H10P 72/0436* (2026.01); *H10P 72/0404* (2026.01); *H10P 72/3302* (2026.01); *H10P 72/3304* (2026.01)

(58) Field of Classification Search
None
See application file for complete search history.

(56) References Cited

U.S. PATENT DOCUMENTS

2018/0190485 A1* 7/2018 Jang ........................ H10P 70/80
2020/0009621 A1* 1/2020 Han ...................... B08B 7/0057
2022/0013393 A1* 1/2022 Jung .................. H10P 72/0414

FOREIGN PATENT DOCUMENTS

JP 2002-305150 A 10/2002
KR 20130014311 A * 2/2013 ....... H01L 21/67034
KR 10-2015-0138975 A 12/2015
KR 20150138975 A * 12/2015 ............. H10P 34/40
KR 2018-0063831 A 6/2018
KR 10-2018-0077949 A 7/2018
KR 2019-0055003 A 5/2019

OTHER PUBLICATIONS

Office Action for Korean Application No. 10-2023-0101639 dated Jan. 6, 2025.

* cited by examiner

*Primary Examiner* — Omair Chaudhri
(74) *Attorney, Agent, or Firm* — Harness, Dickey & Pierce, P.L.C.

(57) ABSTRACT

Disclosed is a substrate treating apparatus including: a treating chamber for treating a substrate; a transfer unit for loading and unloading the substrate into and from a treatment space in which the substrate is treated in the treating chamber; and a heating unit provided to be loaded into and unloaded from the treatment space, and for cleaning the treatment space by heating, in which the treating chamber includes: a chamber body providing the treatment space; and a support unit for supporting the substrate within the treatment space; and a fluid supply unit for supplying a fluid, which treats the substrate, into the treatment space, and the heating unit includes: a base; and a heater installed on the base.

12 Claims, 18 Drawing Sheets

SUBSTRATE TREATING APPARATUS AND SUBSTRATE TREATING METHOD

CROSS-REFERENCE TO RELATED APPLICATIONS

This application claims priority to and the benefit of Korean Patent Application No. 10-2023-0101639 filed in the Korean Intellectual Property Office on Aug. 3, 2023, the entire contents of which are incorporated herein by reference.

TECHNICAL FIELD

The present invention relates to a substrate treating apparatus and a substrate treating method, and more particularly to an apparatus and a method of treating a substrate by supplying a supercritical fluid to the substrate.

BACKGROUND ART

To manufacture semiconductor devices, a desired pattern is formed on a substrate through various processes, such as photography, etching, ashing, ion implantation, and thin film deposition. Each process uses various treatment solutions, and contaminants and particles are generated during the process. To solve the problem, a cleaning process is essential before and after each process to remove contaminants and particles.

Typically, the cleaning process is accomplished by treating the substrate with chemicals and rinse solutions followed by drying. In recent years, organic solvents, such as isopropyl alcohol (IPA), have been used as rinse solutions, and drying is performed using supercritical fluids.

After the supercritical treatment process is performed, contaminants, such as organic solvents and particles, remain in the chamber where the supercritical treatment was performed, such as in the structure of the chamber or in crevices in the inner walls. These residues contaminate the chamber and back-contaminate the subsequently treated substrate. To remove contamination from the chamber, a cleaning solution is typically used to clean the chamber. However, when the chamber is cleaned with a cleaning solution, the device's throughput is reduced because the substrate needs to wait until the cleaning solution attached the interior of the chamber is dried.

SUMMARY OF THE INVENTION

The present invention has been made in an effort to provide a substrate treating apparatus and method that is capable of efficiently performing cleaning of a chamber.

The present invention has also been made in an effort to provide a substrate treating apparatus and method that is capable of reducing the time required to clean a chamber.

An exemplary embodiment of the present invention provides a substrate treating apparatus including: a treating chamber for treating a substrate; a transfer unit for loading and unloading the substrate into and from a treatment space in which the substrate is treated in the treating chamber; and a heating unit provided to be loaded into and unloaded from the treatment space, and for cleaning the treatment space by heating, in which the treating chamber includes: a chamber body providing the treatment space; and a support unit for supporting the substrate within the treatment space; and a fluid supply unit for supplying a fluid, which treats the substrate, into the treatment space, and the heating unit includes: a base; and a heater installed on the base.

In the exemplary embodiment, the base may be provided in a shape supportable by the support unit.

In the exemplary embodiment, the chamber body may include an upper body and a lower body, which are combined with each other to provide the treatment space, the support unit may be provided in a shape supporting an edge region of the substrate on the upper body, a filler may be provided in a position opposite the substrate supported on the support unit under the support unit, a support pin may be provided on a top surface of the filler, and the base may be provided in a shape supportable on the support pin.

In the exemplary embodiment, the transfer unit may include: a hand supporting the substrate and a substrate carrier coupled to the hand and provided to be forwardly and backwardly movable; and a heating unit carrier to which the heating unit is coupled and which is provided to be forwardly and backwardly movable.

In the exemplary embodiment, the heating unit carrier and the substrate carrier may be provided to be spaced apart in upper and lower directions.

In the exemplary embodiment, the number of heaters provided may be one or more, the base may be coupled to the heating unit carrier, the base may be formed with an opening penetrating the base in the upper and lower directions, and the one or more heaters may be positioned in the openings.

In the exemplary embodiment, the substrate treating apparatus may further include a controller for controlling the transfer unit and the heating unit, in which the controller may control the transfer unit and the heating unit to cause the heating unit to clean the treatment space in the state where the heating unit is supported on the support unit.

In the exemplary embodiment, the substrate treating apparatus may further include a controller for controlling the transfer unit and the heating unit, in which the controller may control the transfer unit and the heating unit to cause the heating unit to clean the treatment space in the state where the heating unit is supported on the support pin.

In the exemplary embodiment, the heating unit may be provided to be movable by the transfer unit, the substrate treating apparatus may further include a controller controlling the transfer unit and the heating unit, and the controller may control the transfer unit and the heating unit to clean the treatment space in the state where the heating unit is provided in the transfer unit.

In the exemplary embodiment, the controller may control the transfer unit to change a position of the heating unit within the treatment space while the treatment space is being cleaned.

In the exemplary embodiment, the treating chamber may include: a housing enclosing the chamber body and formed with an inlet through which the substrate is loaded; and an exhaust unit for exhausting an outer region of the chamber body within the housing, and the chamber body may include: an upper body and a lower body, which are combined with each other to provide the treatment space; and a driver for moving the upper body or the lower body so that a relative position between the upper body and the lower body is changed, and the controller may control the driver such that the treatment space is cleaned in the state where the upper body and the lower body are spaced apart from each other and the chamber body is opened.

In the exemplary embodiment, the heater may be a light emitting unit that emits light.

Another exemplary embodiment of the present invention provides a substrate treating method including: a substrate treating operation of loading a substrate into a treatment space of a treating chamber, and supplying fluid to the treatment space to treat the substrate; and a chamber cleaning operation of, after the substrate treating operation, unloading the substrate from the treatment space, and cleaning the treatment space, in which the chamber cleaning operation includes loading a heating unit into the treatment space, and heating the treatment space with a heater provided in the heating unit.

In the exemplary embodiment, the chamber cleaning operation may be an operation of removing organic matters remaining in the treatment space by heat.

In the exemplary embodiment, the fluid may be a supercritical fluid, and in the substrate treating operation, a substrate, on which an organic solvent has been applied, may be loaded and the organic solvent may be removed from the substrate by using the supercritical fluid.

In the exemplary embodiment, the heater may be a light emitting unit that emits light.

Still another exemplary embodiment of the present invention provides a substrate treating apparatus including: a treating chamber for removing organic solvents remaining on a substrate from the substrate by using a supercritical fluid; a transfer unit for loading and unloading the substrate into and from a treatment space in which the substrate is treated in the treating chamber; and a heating unit provided to be loaded into and unloaded from the treatment space, and for cleaning the treatment space by heating, in which wherein the treating chamber may include: a chamber body providing the treatment space; a support unit for supporting the substrate within the treatment space; and a fluid supply unit for supplying the supercritical fluid to the treatment space, and the chamber body may include: an upper body and a lower body, which are combined with each other to provide the treatment space; and a driver for moving the upper body or the lower body so that a relative position between the upper body and the lower body is changed, and the heating unit may include: a base; and a heater installed on the base.

In the exemplary embodiment, the substrate treating apparatus may further include a controller for controlling the transfer unit and the heating unit, in which the controller may control the transfer unit and the heating unit to cause the heating unit to clean the treatment space in the state where the heating unit is supported on the support unit.

In the exemplary embodiment, the substrate treating apparatus may further include a controller for controlling the transfer unit and the heating unit, in which the support unit may be provided in a shape supporting an edge region of the substrate on the upper body, a filler may be provided in a position opposite the substrate supported on the support unit under the support unit, a support pin may be provided on a top surface of the filler, and the controller may control the transfer unit and the heating unit to cause the heating unit to clean the treatment space in the state where the heating unit is supported on the support pin.

In the exemplary embodiment, the heater may be a light emitting unit that emits light.

According to the exemplary embodiment, it is possible to improve efficiency of cleaning the chamber when the chamber is cleaned.

According to the exemplary embodiment, it is possible to remove residues inside the chamber by heating only the surface of the inside of the chamber, thereby reducing damage to the chamber body.

According to the exemplary embodiment, it is possible to reduce the time required to clean the chamber when the chamber is cleaned.

BRIEF DESCRIPTION OF THE DRAWINGS

FIG. 9 is a diagram schematically illustrating a substrate carrier loading a heating unit into the interior of the drying chamber during a heating unit loading operation of FIG. 8.

FIGS. 10 to 12 are diagrams schematically illustrating the interior of the drying chamber according to the exemplary embodiment of FIG. 3 while the chamber cleaning operation of FIG. 8 is being performed.

FIG. 13 is a diagram schematically illustrating the interior of the drying chamber during a heating unit unloading operation of FIG. 8.

FIG. 16 is a diagram schematically illustrating a view of the interior of the drying chamber according to the exemplary embodiment of FIG. 3 while the heating unit carrier of FIG. 15 is performing the heating unit loading operation of FIG. 8.

FIG. 17 is a diagram schematically illustrating the heating unit carrier of FIG. 15 performing a chamber cleaning.

FIG. 18 is a diagram schematically illustrating the interior of the drying chamber while the heating unit carrier of FIG. 15 is performing the heating unit unloading operation of FIG. 8.

DETAILED DESCRIPTION

Figure 1:
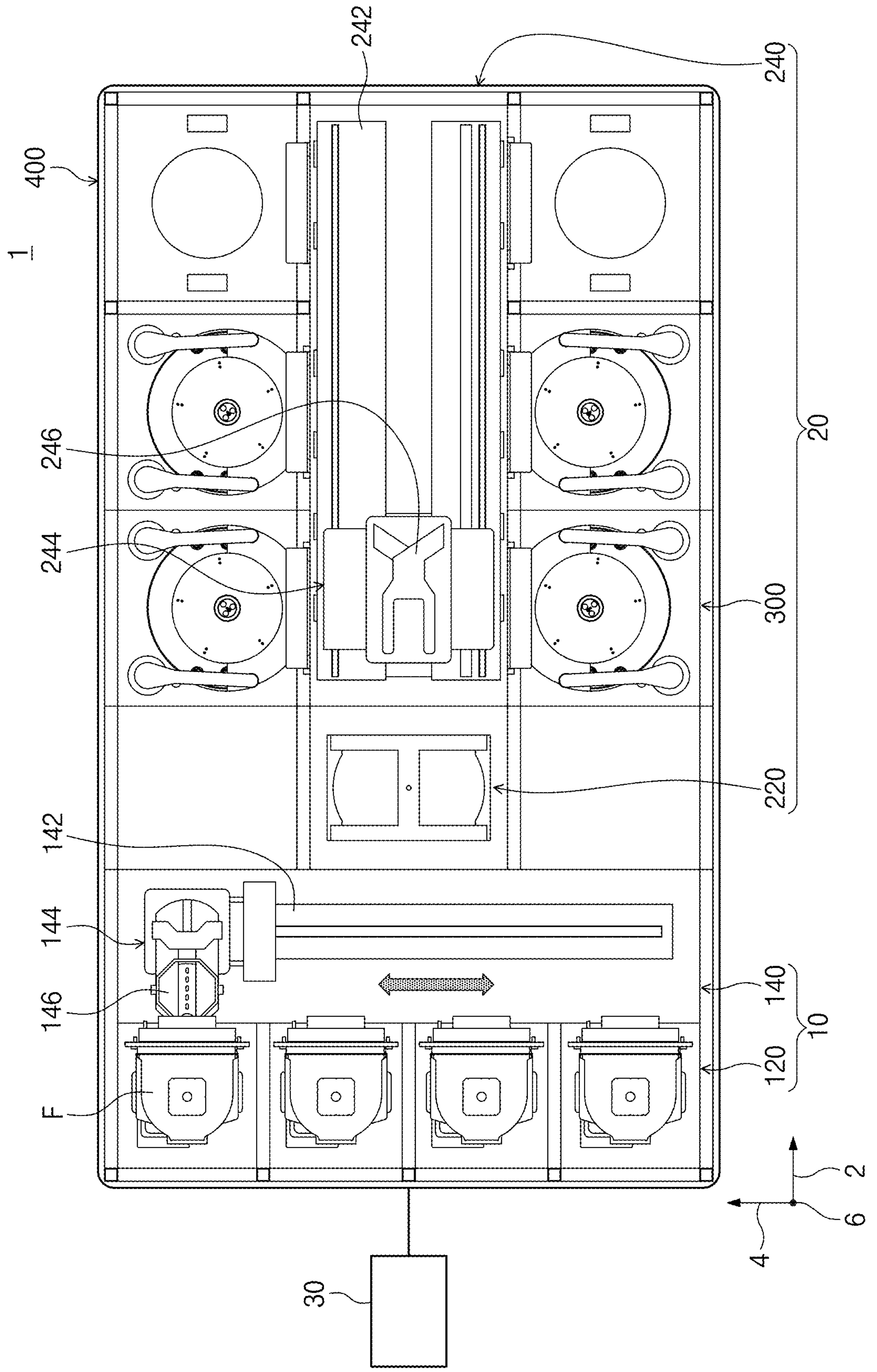
FIG. 1 is a top plan view schematically illustrating a substrate treating apparatus according to an exemplary embodiment of the present invention.

Example embodiments will now be described more fully with reference to the accompanying drawings. Example embodiments are provided so that this disclosure will be thorough and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

When the term "same" or "identical" is used in the description of example embodiments, it should be understood that some imprecisions may exist. Thus, when one element or value is referred to as being the same as another element or value, it should be understood that the element or value is the same as the other element or value within a manufacturing or operational tolerance range (e.g., ±10%).

When the terms "about" or "substantially" are used in connection with a numerical value, it should be understood that the associated numerical value includes a manufacturing or operational tolerance (e.g., ±10%) around the stated numerical value. Moreover, when the words "generally" and "substantially" are used in connection with a geometric shape, it should be understood that the precision of the geometric shape is not required but that latitude for the shape is within the scope of the disclosure.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

In the present exemplary embodiment, the present invention will be described based on a device for removing an organic solvent remaining on a substrate by using a supercritical fluid. However, the present exemplary embodiment is not limited thereto, and may be applied to other types of substrate treating apparatuses where organic matter may remain in a chamber after performing a substrate treatment process.

In the following, one example of a substrate treating apparatus of the present invention will be described in detail with reference to the accompanying drawings.

FIG. 1 is a top plan view schematically illustrating a substrate treating apparatus according to an exemplary embodiment of the present invention. Referring to FIG. 1, the substrate treating apparatus 1 includes an index module 10 and a treating module 20. According to the exemplary embodiment, the index module 10 and the treating module 20 are disposed in one direction. Hereinafter, the direction in which the index module 10 and the treating module 20 are disposed is defined as a first direction 2. When viewed from above, the direction perpendicular to the first direction 2 is defined as a second direction 4, and the direction perpendicular to the plane including both the first direction 2 and the second direction 4 is defined as the third direction 6.

The index module 10 transfers a substrate W to the treating module 20 which treats a substrate W from a container F in which the substrate W is accommodated. The index module 10 accommodates the substrate W that has been completely treated in the treating module 20 into the container F. A longitudinal direction of the index module 10 is provided in the second direction 4. The index module 10 includes a load port 110 and an index frame 140.

The container F in which the substrate W is accommodated is seated in the load port 120. The load port 120 is located at an opposite side of the treating module 20 based on the index module 140. A plurality of load ports 120 may be provided. The plurality of load ports 120 may be arranged in a line along the second direction 4. The number of load ports 120 may be increased or decreased according to process efficiency of the treating module 20 and a condition of foot print, and the like.

A plurality of slots (not illustrated) is formed in the container F. The slots (not illustrated) may accommodate the substrates W with the substrates W positioned horizontally with respect to the ground. As the container C, an airtight container, such as a Front Opening Unfed Pod (FOUP) may be used. The container F may be placed on the load port 120 by a transfer means (not illustrated), such as an overhead transfer, an overhead conveyor, or an automatic guided vehicle, or an operator.

An index rail 142 and an index robot 144 are provided inside the index frame 140. The index rail 142 is provided along the second direction 4 in its longitudinal direction in the index frame 140. The index robot 144 may transfer the substrate W. The index robot 144 may transfer the substrate W between the index module 10 and a buffer unit 220 which will be described later.

The index robot 120 includes an index hand 146. On the index hand 146, the substrate W is seated. The index hand 146 may be provided to be movable in the second direction 4 on the index rail 142. Therefore, the index hand 146 is movable forward and backward along the index rail 142. Additionally, the index hand 146 may be provided to be rotatable about the third direction 6 as the axis. Additionally, the index hand 146 may be provided to be vertically movable along the third direction 6. A plurality of index hands 146 may be provided. The plurality of index hands 146 may be provided to be spaced apart from each other in the vertical direction. The plurality of index hands 146 may move forwardly, backwardly, and rotationally independently of each other.

The controller 30 may control the substrate treating apparatus 1. The controller 30 may include a process controller formed of a microprocessor (computer) that executes the control of the substrate treating apparatus 1, a user interface formed of a keyboard in which an operator performs a command input operation or the like in order to manage the substrate treating apparatus 1, a display for visualizing and displaying an operation situation of the substrate treating apparatus 1, and the like, and a storage unit storing a control program for executing the process executed in the substrate treating apparatus 1 under the control of the process controller or a program, that is, a treating recipe, for executing the process in each component according to various data and treating conditions. Further, the user interface and the storage unit may be connected to the process controller. The treating recipe may be stored in a storage medium in the storage unit, and the storage medium may be a hard disk, and may also be a portable disk, such as a CD-ROM or a DVD, or a semiconductor memory, such as a flash memory.

The controller 30 may control the substrate treating apparatus 1 so as to perform a substrate treating method described below. For example, the controller 30 may control the configurations provided in the drying chamber 400 to perform a substrate treating method described below.

For example, the controller 30 may control a transfer unit 244 and the heating unit 500 to cause the heating unit 500, which is to be described below, to clean a treatment space 421.

The treating module 20 includes a buffer unit 220, a transfer frame 240, a liquid treating chamber 300, and a drying chamber 400. The buffer unit 220 provides a buffer space where the substrate W loaded into the treating module 20 and the substrate W being unloaded from the treating module 20 temporarily stay. The transfer frame 240 provides a transfer space for transferring the substrate W between the buffer unit 220, the liquid treating chamber 300, and the drying chamber 400.

The liquid treating chamber 300 may perform a liquid treatment process by supplying liquid onto the substrate W to liquid-treat the substrate W. The drying chamber 400 may perform a drying process to remove any remaining liquid on the substrate W. The liquid treating chamber 300 and the drying chamber 400 may perform a cleaning process. The cleaning process may be performed sequentially in the liquid treating chamber 300 and the drying chamber 400. For example, the liquid treating chamber 300 may treat the substrate W by supplying chemicals, rinse solutions, and/or organic solvents onto the substrate W. For example, in the drying chamber 400, a drying treatment may be performed by using a supercritical fluid to remove any residual liquid on the substrate W.

The buffer unit 220 may be disposed between the index frame 140 and the transfer frame 240. The buffer unit 220 may be located at one end of the transfer frame 240. A slot (not illustrated) in which the substrate W is placed is provided inside the buffer unit 220. A plurality of slots (not illustrated) is provided. The plurality of slots (not illustrated) may be spaced apart from each other along the third direction 6. A front face and a rear face of the buffer unit 220 are opened. The front face may be a face facing the index module 10, and the rear face may be a face facing the transfer frame 240. The index robot 144 may approach the buffer unit 220 through the front face, and the transfer unit 244, which will be described later, may approach the buffer unit 220 through the rear face.

The transfer frame 240 may be provided along the first direction 2 in a longitudinal direction thereof. The liquid treating chamber 300 and the drying chamber 400 may be disposed on both sides of the transfer frame 240. The liquid treating chamber 300 and the drying chamber 400 may be disposed on the lateral portion of the transfer frame 240. The transfer frame 240 and the liquid treating chamber 300 may be disposed along the second direction 4. Further, the transfer frame 240 and the drying chamber 400 may be disposed along the second direction 4.

In one example, the liquid treating chambers 300 are disposed on opposite sides of the transfer frame 240, and the drying chambers 400 are disposed on opposite sides of the transfer frame 240. The liquid treating chambers 300 may be disposed relatively closer to the buffer unit 220 than the drying chambers 400. At one side of the transfer chamber 240, the liquid treating chambers 300 may be provided in an arrangement of A×B (each of A and B is 1 or a natural larger than 1) in the first direction 2 and the third direction 6. Here, A is the number of liquid treating chambers 300 provided in a line along the first direction 2, and B is the number of liquid treating chambers 300 provided in a line along the third direction 6. For example, when four liquid treating chambers 300 are provided on one side of the transfer frame 240, the liquid treating chambers 300 may be arranged in a 2×2 arrangement. The number of liquid treating chambers 300 may be increased or decreased. As described above, the liquid treating chambers 300 may be provided only on one side of the transfer frame 240, and only the drying chambers 400 may be arranged on the other side opposite the one side. Further, the liquid treating chamber 300 and the drying chamber 400 may be provided in a single layer on one side and opposite sides of the transfer frame 240.

The transfer frame 240 includes a guide rail 242 and a transfer unit 244. The guide rail 242 is provided in the transfer frame 240 so that a longitudinal direction is the first direction 2. The transfer unit 244 may be provided to be linearly movable along the first direction 2 on the guide rail 242. The transfer unit 244 transfers the substrate W between the buffer unit 220, the liquid treating chamber 300, and the drying chamber 400.

The transfer unit 244 includes a transfer hand 246 on which the substrate W is placed. The transfer hand 246 may be provided to be movable along the first direction 2 on the guide rail 242. Accordingly, the transfer hand 246 is movable forwardly and backwardly along the guide rail 242. In addition, the transfer hand 246 may be provided to be rotatable about the third direction 6 and to be movable along the third direction 6. A plurality of transfer hands 246 may be provided. The plurality of transfer hands 246 may be provided to be spaced apart from each other in the vertical direction. The plurality of transfer hands 246 may move forwardly, backwardly, and rotationally independently of each other.

The liquid treating chamber 300 performs a liquid-treatment process on the substrate W. For example, the liquid treating chamber 300 may be a chamber that performs a cleaning process to remove process byproducts or the like attached to the substrate W. The liquid treating chamber 260 may have a different structure depending on the type of process treating the substrate W. Unlike this, each of the liquid treating chambers 300 may have the same structure.

Figure 2:
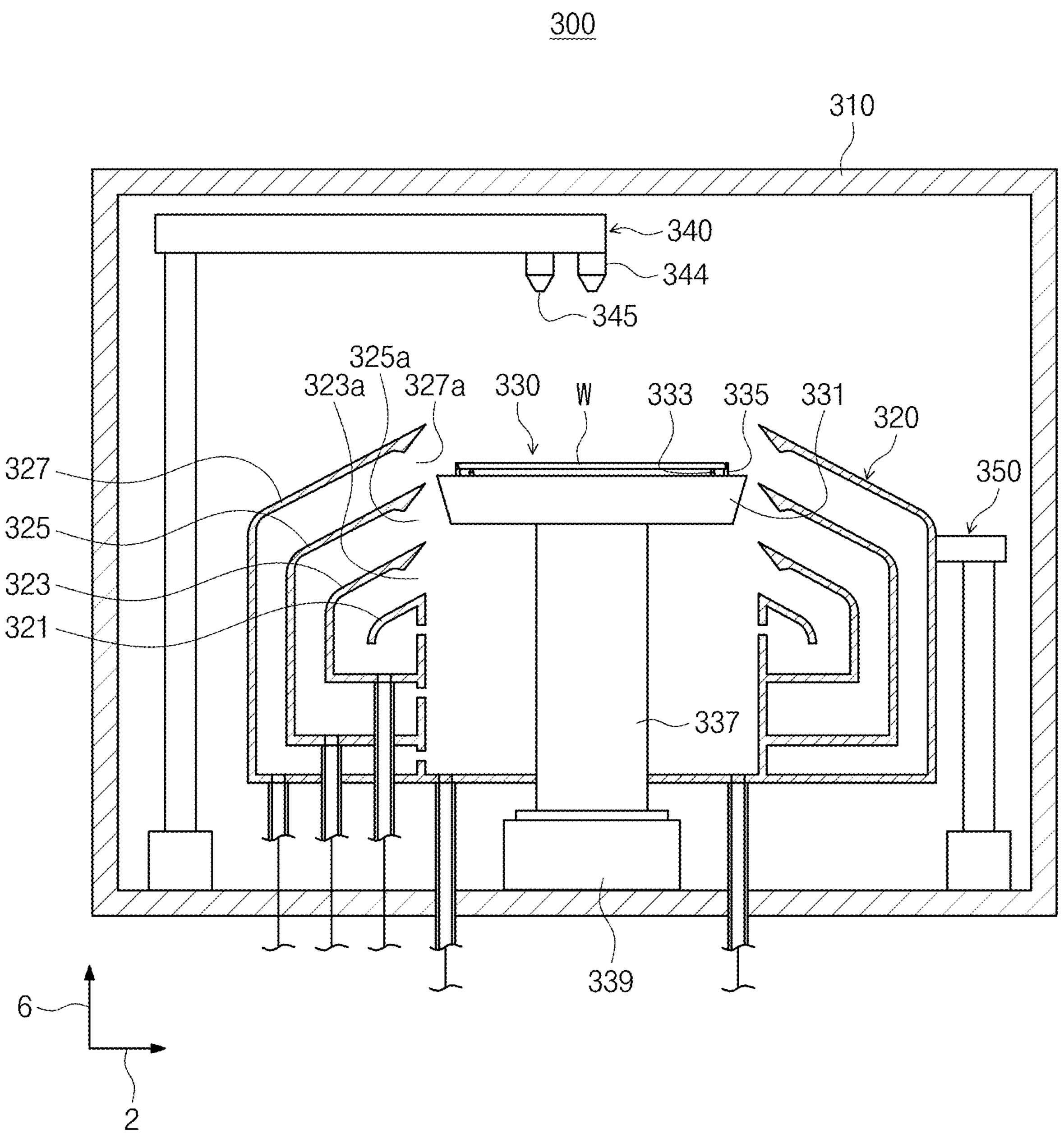
FIG. 2 is a diagram schematically illustrating an exemplary embodiment of a liquid treating chamber of FIG. 1.

FIG. 2 is a diagram schematically illustrating an exemplary embodiment of the liquid treating chamber of FIG. 1. Referring to FIG. 2, the liquid treating chamber 300 includes a housing 310, a treatment container 320, a support unit 330, and a liquid supply unit 340.

The housing 310 has a space therein. The housing 310 is provided in the shape of a generally rectangular parallelepiped. An opening (not illustrated) is formed at one side of the housing 310. The opening (not illustrated) function as an entrance through which the substrate W is loaded into or unloaded from the interior space of the housing 310 by the transfer unit 244. The treatment container 320, the support unit 330, and the liquid supply unit 340 are disposed in the interior space of the housing 310.

The treatment container 320 has a treatment space with an opened upper portion. The treatment container 320 may be a bowl having a treatment space. The treatment container 320 may be provided to surround the treatment space. The treatment space of the treatment container 320 is provided as a space in which the substrate W is supported and rotated by the support unit 330 which will be described later. The treatment space is provided as a space for the liquid supply unit 340, which will be described later, to supply liquid onto the substrate W to process the substrate W.

According to the example, the treatment container 320 may have a guide wall 321 and a plurality of collection containers 323, 325, and 327. Each of the collection containers 323, 325, and 327 separately collects different liquids from the liquids used to treat the substrate W. The collection containers 323, 325, and 327 may each have a collection space for collecting the liquid used to treat the substrate W.

The guide wall 321 and the collection containers 323, 325, and 327 are provided in the shape of an annular ring that surrounds the support unit 330. When liquid is supplied to the substrate W, the liquid that is dispersed by the rotation of the substrate W may enter the collection space through the inlets of the respective collection containers 323, 325, and 327 described below. Different types of liquid may be introduced into of the collection containers 323, 325, and 327, respectively.

The support unit 330 supports and rotates the substrate W in the treatment space. The support unit 330 may have a spin chuck 331, a support pin 333, a chuck pin 335, a rotation shaft 337, and a driver 339.

The spin chuck 331 has a top surface that is substantially circular when viewed from the top. The top surface of the spin chuck 331 may have a diameter larger than the substrate W.

A plurality of support pins 333 is provided. The support pin 333 is disposed on the top surface of the spin chuck 331. The support pins 333 are spaced apart at regular intervals at the edge portion of the top surface of the spin chuck 331. The support pins 333 are formed to protrude upwardly from the top surface of the spin chuck 331. The support pins 333 are arranged in combination with each other to form an overall annular ring shape. The support pin 333 supports an edge region of the rear surface of the substrate W so that the substrate W is spaced apart from the top surface of the spin chuck 331 at a predetermined distance.

A plurality of chuck pins 335 is provided. The chuck pins 335 are disposed relatively farther away from the center region of the spin chuck 331 than the support pins 333. The chuck pins 335 protrude upwardly from the top surface of the spin chuck 331. The chuck pin 335 supports a lateral region of the substrate W to prevent the substrate W from laterally deviating from its stationary position when the substrate W is rotated.

The rotation shaft 337 is coupled with the spin chuck 331. The rotation shaft 337 is coupled to the bottom surface of the spin chuck 331. The rotation shaft 337 may be provided with a longitudinal direction facing the third direction 6. The rotation shaft 337 is provided to be rotatable by receiving power from the driver 339. The rotation shaft 337 is rotated by the driver 339, and the spin chuck 331 is rotated by a medium of the rotation shaft 337. The driver 339 rotates the rotation shaft 337. The driver 339 is capable of varying the rotational speed of the rotation shaft 337. The driver 339 may be a motor that provides driving force. However, the driver is not limited thereto, and may be provided in various variations with any known device that provides driving force.

The liquid supply unit 340 supplies the liquid to the substrate W. The liquid supply unit 340 supplies a liquid to the substrate W supported by the support unit 330. The liquid supplied to the substrate W by the liquid supply unit 340 is provided in a plurality of types. In one example, the liquid supplied to the substrate W by the liquid supply unit 340 may include a first liquid and a second liquid. The first liquid and the second liquid may each be different types of liquid. The first liquid and the second liquid may be supplied sequentially to the substrate W.

The first liquid supply nozzle 344 supplies the first liquid onto the substrate W. The first liquid supply nozzle 344 may supply the first liquid onto the substrate W supported on the support unit 330. The second liquid supply nozzle 345 supplies the second liquid onto the substrate W. The second liquid supply nozzle 345 supplies the second liquid onto the substrate W supported on the support unit 330.

The first liquid and the second liquid may be any one of a chemical, a rinse liquid, and an organic solvent. For example, the chemical may include diluted sulfuric acid ($H_2SO_4$), phosphoric acid ($P_2O_5$), hydrofluoric acid (HF), and ammonium hydroxide ($NH_4OH$). For example, the rinse liquid may include water or deionized water (DIW). For example, the organic solvent may include alcohol, such as isopropyl alcohol (IPA). According to the exemplary embodiment, the first liquid may be a liquid that removes any residual film or foreign substances remaining on the substrate W. According to the exemplary embodiment, the second liquid may be a liquid that neutralizes the first liquid. In one example, the second liquid may be a liquid that is readily soluble in a drying fluid. Further, the second liquid may be a liquid that is readily soluble in a supercritical fluid used in the drying chamber 400 which will be described later. In one example, the second liquid may be a liquid that is relatively more soluble in the drying fluid described herein compared to the first liquid.

The lifting unit 350 is disposed in the interior space of the housing 310. The lifting unit 350 adjusts the relative height between the treatment container 320 and the support unit 330. The lifting unit 350 may move the treatment container 320 in a straight line in the third direction 6. Accordingly, since the height of the collection containers 323, 325, and 327 for collecting the liquid is changed according to the type of the liquid supplied to the substrate W, the liquids may be separated and collected. As described above, the treatment container 320 is fixedly installed, and the lifting unit 350 moves the support unit 330 in an upward or downward direction to change the relative height between the support unit 330 and the treatment container 320.

Figure 3:
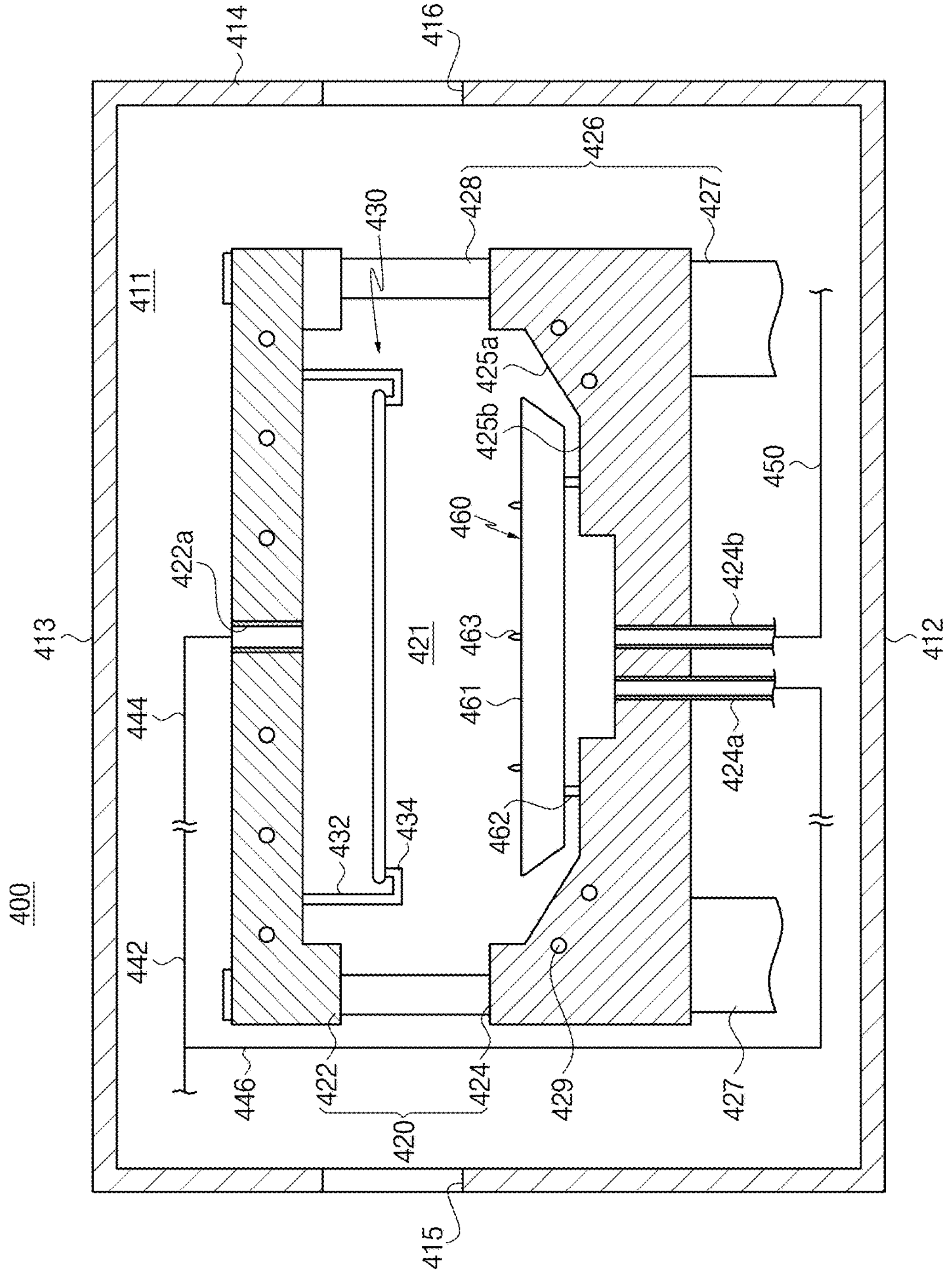
FIG. 3 is a diagram schematically illustrating an exemplary embodiment of a drying chamber of FIG. 1.

FIG. 3 is a diagram schematically illustrating an exemplary embodiment of the drying chamber of FIG. 1. Referring to FIG. 3, the drying chamber 400 may include a housing 410, a chamber body 420, a support unit 430, a fluid supply unit 440, an exhaust line 450, a filler member 460, and a controller 470.

The housing 410 is provided in a barrel shape having an interior space 411 inside. For example, the housing 410 may be provided in a cuboidal shape. The housing 410 includes a bottom wall 412, a top wall 413, and a plurality of lateral walls 414. The top wall 413 and the bottom wall 412 are disposed opposite each other. The plurality of lateral walls 414 connects the bottom wall 412 and the top wall 413. Any one of the plurality of lateral walls 414 is provided with an opening 415 through which the substrate W is loaded and unloaded. The opening 415 is formed in the lateral wall 414 opposite the passage through which the transfer unit 244 is traveling.

The exhaust unit 416 is provided on another lateral wall 414 among the plurality of lateral walls 414. In one example, the exhaust unit 416 may be formed in the lateral wall 414 opposite to the lateral wall 414 in which the opening 415 is formed. The exhaust unit 416 exhausts the atmosphere of the interior space 411 of the housing 410 and the treatment space 421 of the chamber body 420. When the drying chamber is opened, contaminants inside the drying chamber 400 may be exhausted to maintain a high level of cleanliness inside the drying chamber 400.

An interior space 411 of the housing 410 accommodates the chamber body 420. The chamber body 420 provides the treatment space 421 in which drying treatment is performed on the substrate W. The chamber body 420 may include an upper body 422, a lower body 424, and a lifting member 426.

The upper body 422 and the lower body 424 are combined with each other to provide the treatment space 421. The upper body 422 is positioned above the lower body 424. The upper body 422 may be provided with a first supply port 422*a*, and the lower body may be formed with a second supply port 424*a*. In one example, the first supply port 422*a* may be formed in a central region of the upper body 422 when viewed from above. In one example, the second supply port 424*a* may be formed in a region that is eccentric at a predetermined distance from the center axis of the lower body 424 when viewed from above. The lower body 424 may be further provided with an exhaust port 424*b*. The exhaust port 424*b* may be formed in a center portion of the lower body 424 when viewed from above. For example, the exhaust port 424*b* may be disposed at a location spaced a predetermined distance from the second supply port 424*a*.

The upper body 422 is fixed in position, and the lower body 424 may be raised by the lifting member 426 which will be described later. When the lower body 424 descends and is spaced apart from the upper body 422, the treatment space 421 is opened. When the treatment space 421 is opened, the substrate W may be loaded into the treatment space 421, or the substrate W may be unloaded from the treatment space 421. The substrate W loaded into the treatment space 421 may be the substrate W that has completed liquid treatment in the liquid treating chamber 300.

When the lower body 424 is moved upwardly and is in close contact with the upper body 422, the treatment space 421 is sealed. When the treatment space 421 is sealed, a drying treatment may be performed on the substrate W by supplying a supercritical fluid.

The lifting member 426 elevates the lower body 424. The lifting member 426 may include a driver to elevate the lower body 424. For example, the lifting member 426 may include a cylinder 427. The lifting member may continuously pressurize the lower body so that the upper body 422 and the lower body 424 remain in close contact while the drying treatment is performed.

Optionally, a clamping unit (not illustrated) may be provided for clamping the upper body and the lower body to prevent the treatment space from being opened by the internal pressure of the treatment space during the process.

According to one example of the present invention described above, the present invention has been described based on the case where the lower body 424 moves in the upper and lower directions to seal the treatment space 421 by way of example, but is not limited thereto. For example, the upper body 422 may move in the upper and lower directions, and the lower body 424 may be fixed in position.

A heater 429 may be installed in the chamber body 420. In one example, the heater 429 may be installed while being buried inside a wall of at least one of the upper body 422 and the lower body 424. The heater 429 may heat the process fluid supplied to the treatment space 421 to a critical temperature or higher to maintain the process fluid in a supercritical fluid phase, or, when the process fluid is liquefied, the heater 429 may heat the process fluid back into a supercritical fluid phase.

The support unit 430 supports the substrate W within the treatment space 421. The support unit 430 may be fixedly installed on the bottom surface of the upper body 422. The support unit 430 may have a fixing rod 432 and a mounting holder 434.

The fixing rod 432 may be fixedly installed on the upper body 422 such that the fixing rod 432 protrudes downwardly from the bottom surface of the upper body 422. The fixing rod 432 may be provided in the upper and lower directions along its length. A plurality of fixing rods 432 may be provided. The plurality of fixing rods 432 is spaced apart from each other. When the substrate W is loaded into or unloaded from the space enclosed by the plurality of fixing rods 432, the plurality of fixing rods 432 is disposed such that the plurality of fixing rods 432 does not interfere with the substrate W. Each of the fixing rods 432 is coupled to the mounting holder 434.

The mounting holder 434 extends from the fixing rod 432. The mounting holder 434 may extend from the bottom end of the fixing rod 432 in a direction toward the space enclosed by the fixing rods 432. The mounting holder 434 may extend upwardly from the extended end portion to support a region of the back edge of the substrate W. According to one example, the back surface of the substrate W may be an unpatterned face and the top surface of the substrate W may be a patterned face. Due to the above-described structure, the edge region of the substrate W loaded into the treatment space 421 may be placed on the mounting holder 434. Additionally, a portion of the entire top surface of the substrate W, a center region of the bottom surface of the substrate W, and a portion of the edge region of the bottom surface of the substrate W may be exposed to the process fluid supplied to the treatment space 421.

The fluid supply unit 440 supplies the process fluid to the treatment space 421. In the exemplary embodiment, carbon dioxide ($CO_2$) gas in a supercritical state may be used as the process fluid. The carbon dioxide may be made supercritical by a temperature of 30 É or higher and a pressure of 7.4 MPa or higher. In the following, the process fluid is described using carbon dioxide gas as an example. According to one example, the process fluid may be supplied to the treatment space 421 in a supercritical state. However, the present invention is not limited thereto, and the process fluid may be supplied to the treatment space 421 in a gaseous state and phase-change to the supercritical state within the treatment space 421. In one example, the fluid supply unit 440 includes a main supply line 442, an upper branch line 444, and a lower branch line 446. The upper branch line 444 and the lower branch line 446 are branched from the main supply line 442. The upper branch line 444 is coupled to the first supply port 422*a* to supply process fluid from the top of the substrate W placed on the support unit 430. The lower branch line 446 is coupled to the second supply port 424*a* to supply the process fluid from the lower portion of the substrate W placed on the support unit 430.

The exhaust line 450 exhausts the atmosphere of the treatment space 421. The exhaust line 450 may be connected to the exhaust port 424*b* formed in the lower body 424. The process fluid flowing through the treatment space 421 is discharged to the outside of the chamber body 420 via the exhaust line 450.

The filler member 460 is located inside the treatment space 421. The filler member 460 is located under the support unit 430. When viewed from above, the filler member 460 may be disposed to overlap the supply port 424*a* and the exhaust port 424*b* formed in the lower body 424. The filler member 460 may prevent the process fluid supplied through the supply port 424*a* from being discharged directly toward the substrate W and the substrate W from being damaged. The filler member 480 includes a filler 461, a support fixture 462, and a support pin 463.

The filler 461 is provided in the shape of a plate having a predetermined thickness. The filler 461 may be in a hollow or filled form. The filler 461 has a top surface, a bottom surface, and a lateral surface. The top surface and the bottom surface face each other to be disposed side by side. The top surface has a larger area than the bottom surface. In the state where the interior of the chamber body 420 is sealed, the top surface of the filler 461 may maintain a predetermined spacing from the bottom surface of the substrate W supported by the mounting holder 434. The bottom surface of the filler 461 is disposed to face a first bottom surface 425*b* of the chamber body 420. The bottom surface is spaced apart from the first bottom surface 425*b* of the chamber body 420 at predetermined intervals. The filler 461 may be supported by the support fixture 482 to be spaced apart from the first bottom surface 425*b* of the chamber body 420. The support fixture 462 may be provided in the shape of a rod. A plurality of support fixtures 462 may be provided. The plurality of support fixtures 462 is spaced apart from each other by a predetermined distance. The lateral surface of the filler 461 connects the top surface and the bottom surface of the filler 461. The lateral surface of the filler 461 extends from the bottom surface and is sloped upwardly such that the cross-sectional area of the filler becomes progressively wider toward the top. The lateral surface of the filler 461 may be provided in line with an inclined surface 425*a*. The lateral surface of the filler 461 may be provided with one region facing the inclined surface 425*a*. The lateral surface of the filler 461 is spaced apart from the inclined surface 425*a* by a predetermined distance. In one example, the lateral surface of the filler 461 may be spaced apart from the inclined surface 425*a* by a distance of 0.1 cm to 2 cm.

The filler 461 includes a plurality of support pins 463 provided on its top surface. The plurality of support pins 463 may support the bottom surface of the substrate W when the interior of the chamber body 420 is sealed. The height at which the plurality of support pins 463 protrude from the top surface of the filler 461 may be at a height equal to or less than a spacing between the top surface of the filler 461 and the bottom surface of the substrate W when the mounting holder 434 supports the bottom surface of the substrate and the interior of the chamber body 420 is sealed.

After the drying chamber 400 removes the residual liquid on the substrate W by using the process fluid as described in the example above, the residual material on the substrate W remains in the treatment space 421 of the drying chamber 400 and the inner wall surface of the chamber body 420. These residues may be present in dead zones within the treatment space or between the internal structures of the chamber body 420, particularly at the sealing points where the upper body 422 and lower body 424 engage during the supply and the discharge of the process fluid. For example, residues may come from organics containing organic solvents, such as Isopropyl Alcohol (IPA), for example, or from other sources.

Contamination of the chamber body 420 with these residues may contaminate the substrate W that is subsequently processed in the chamber body 420.

Therefore, to remove any residual contaminant of the chamber body 420, the interior of the chamber body 420 is cleaned by the heating unit 500.

The heating unit 500 includes a base 510 and a heater 520. The heater 520 may be mounted to the base 510.

According to one example, the base 510 may be provided in a shape supportable on the support unit 430 within the chamber body 420. Optionally, the base 510 may be provided in a shape that is supportable on the plurality of support pins 463. For example, the base 510 may be provided in a shape corresponding to the substrate W. Optionally, the base may be provided in a shape that may be placed on the bottom wall of the chamber.

The base 510 may be provided with a power unit 530 to provide power to the heater 520.

The base 510 may be provided with one or more heaters 520 that are installed on the base 510.

The heater 520 includes a heat source that emits heat. For example, the heat source may be a light source. In one example, the heater 520 may be a lamp. In another example, the heater 520 may be a heating wire that utilizes resistance to generate heat.

Various exemplary embodiments may exist for the structure in which the heater 520 is installed in the base 510. According to the exemplary embodiment, one or more openings that penetrate the base 510 in the vertical direction are formed in the base 510, and one or more heaters 520 may be installed in the openings. In another exemplary embodiment, the one or plurality of heaters 520 may be installed on a top surface and/or a bottom surface of the base 510.

The heating unit 500 may be stored in the buffer unit 220. Optionally, the heating unit 500 may be stored in a separate space provided at a location on the path of the transfer unit 244.

Figure 4:
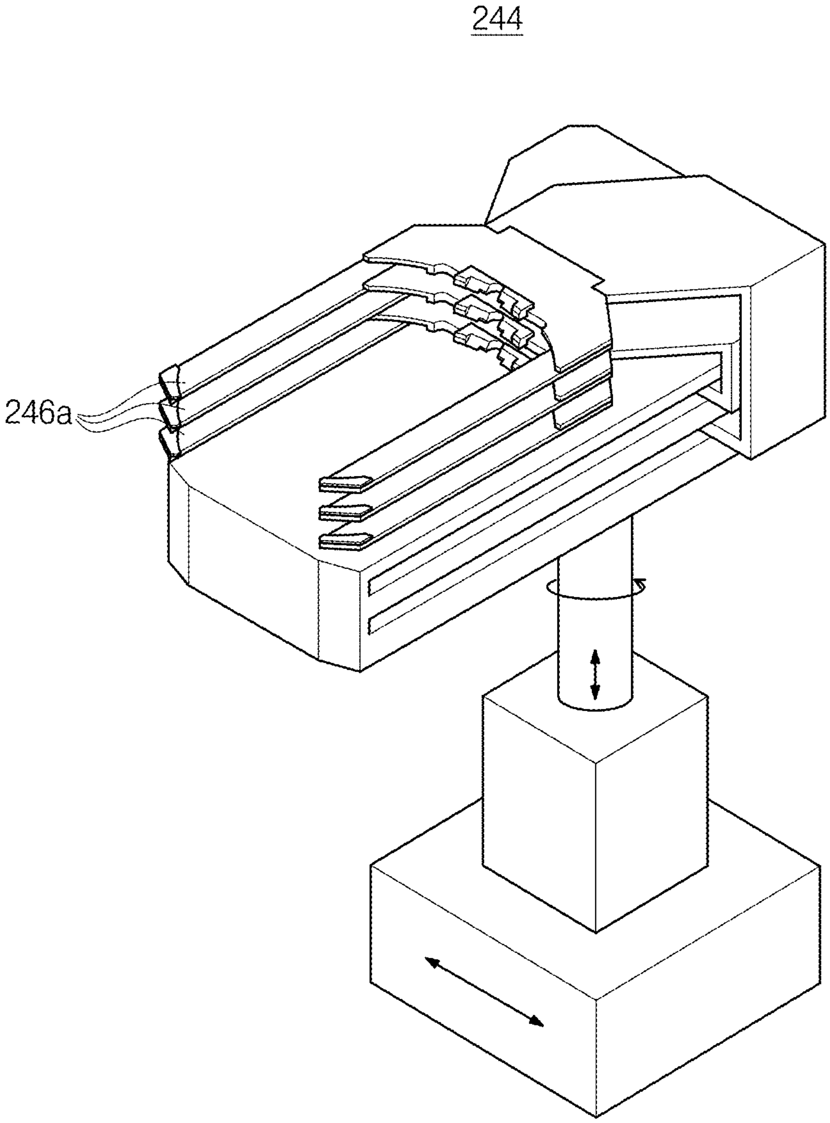
FIG. 4 is a perspective view illustrating an exemplary embodiment of a transfer robot and a transfer hand.

FIG. 4 is a perspective view illustrating an exemplary embodiment of the transfer robot and the transfer hand. The plurality of transfer hands 246 may move forwardly, backwardly, and rotationally independently of each other, so that a plurality of substrate carriers 246*a* may perform loading and unloading the substrate W into and from the treatment space 421 of the drying chamber 400, or load or unload the heating unit 500 stored in the buffer unit 220 into and from the treatment space 421.

Figure 5:
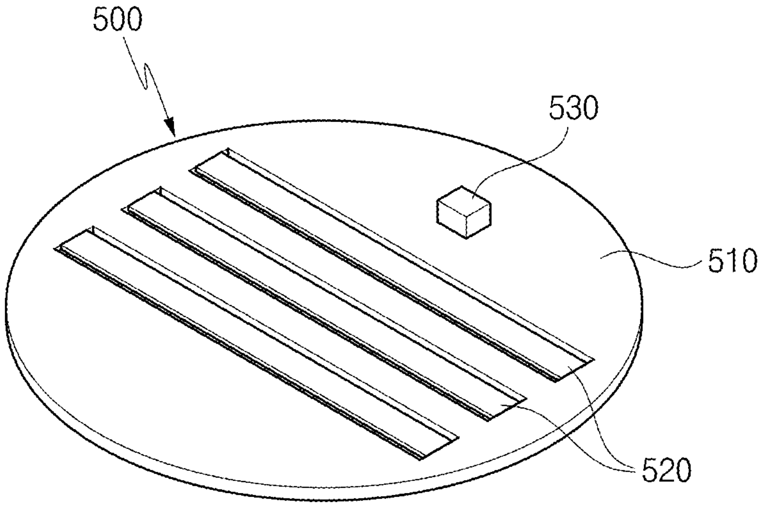
FIG. 5 is a perspective view illustrating an example of a heating unit.

FIG. 5 is a perspective view illustrating an example of the heating unit.

Referring to FIG. 5, the heating unit 500 includes a base 510, a heater 520, and a power unit 530.

The base 510 is provided in the shape of a disk. The base 510 is formed with an opening that penetrates in the upper and lower directions. The heater 520 is positioned in the opening. On the top surface of the base 510, the power unit 530 is provided. When power is applied to the heater 520 through the power unit 530, heat generated from the heater 520 may be delivered in the upper and lower directions of the base 510. The plurality of heaters 520 may be positioned in the openings. Optionally, a plurality of openings may be formed in the base 510, and the heater 520 may be positioned in each of the openings.

Figure 6:
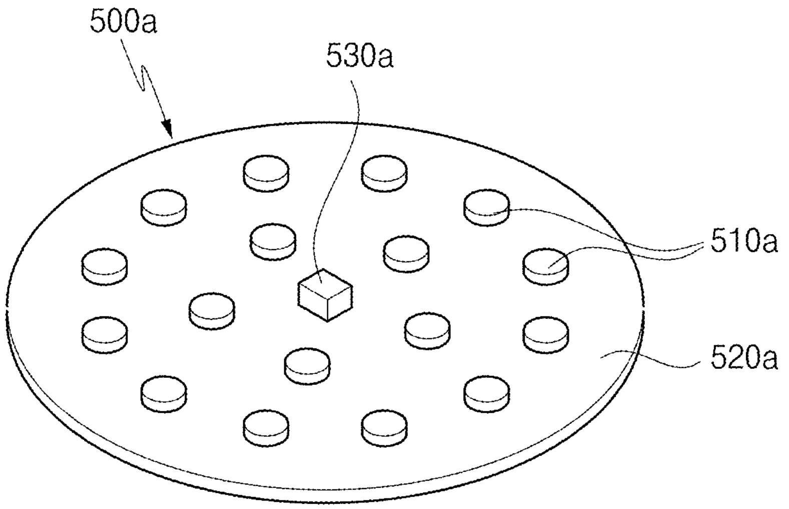
FIGS. 6 and 7 are perspective views illustrating other examples of the heating unit.
Figure 7:
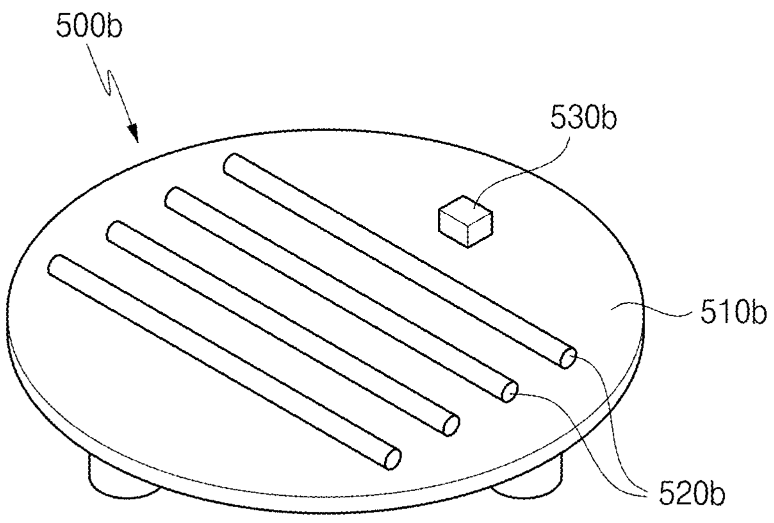

FIGS. 6 and 7 are perspective views illustrating other examples of the heating unit.

Referring to FIG. 6, the heating unit 500*a* includes a base 510*a*, one or more heaters 520*a*, and a power unit 530*a*.

The upper plate 510*a* is provided in a disk shape. The heaters 520*a* are installed on a top surface of the base 510*a*. When power is applied to the heating unit 520*a*, heat generated from the heating unit 520*a* may be transferred to the upper direction of the base 510*a*.

Referring to FIG. 7, a heating unit 500*b* includes a base 510*b*, one or more heaters 520*b*, and a power unit 530*b*.

The base 510*b* is provided in the shape of a disk. The bottom surface of the base 510*b* is provided with one or more support members capable of supporting the base 510*b*. On the top surface of the base 510*b*, the plurality of heaters 520*b* and the power unit 530*b* are installed. When power is applied to the heaters 520*b* via the power unit 530*b*, heat generated by the heaters 520*b* may be transferred in all directions.

Figure 8:
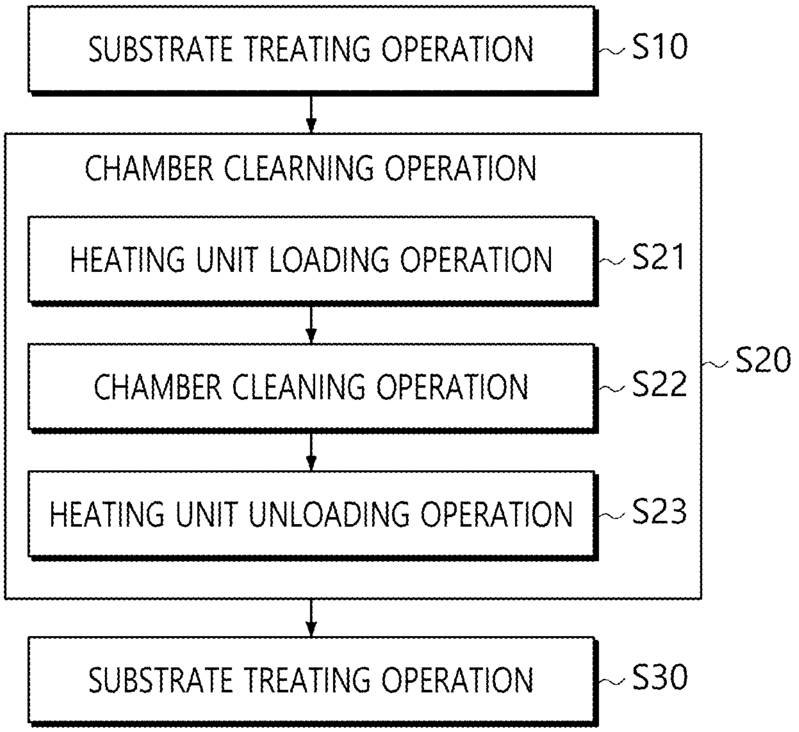
FIG. 8 is a flowchart illustrating a method of treating a substrate in the drying chamber according to the exemplary embodiment of FIG. 3.

FIG. 8 is a flowchart illustrating a method of treating a substrate in the drying chamber according to the exemplary embodiment of FIG. 3.

Referring to FIG. 8, a substrate treating method according to an exemplary embodiment of the present invention includes a substrate treating operation S10 and a chamber cleaning operation S20. In the substrate treating operation S10, in the state where a substrate W is introduced into the drying chamber 400, a process is performed to remove liquid residual on the substrate W by using a process fluid. When the substrate treating operation S10 is terminated, the substrate W is unloaded from the drying chamber 400 by the substrate carrier 246*a* of the transfer unit 244. The chamber cleaning operation S20 is then performed.

The chamber cleaning operation S20 may include a sequence of operations including a heating unit loading operation S21, a chamber cleaning operation S22, and a heating unit unloading operation S23.

FIGS. 9 to 13 are diagrams schematically illustrating the interior of the drying chamber according to the exemplary embodiment of FIG. 3 while the chamber cleaning operation of FIG. 8 is being performed.

Figure 9:
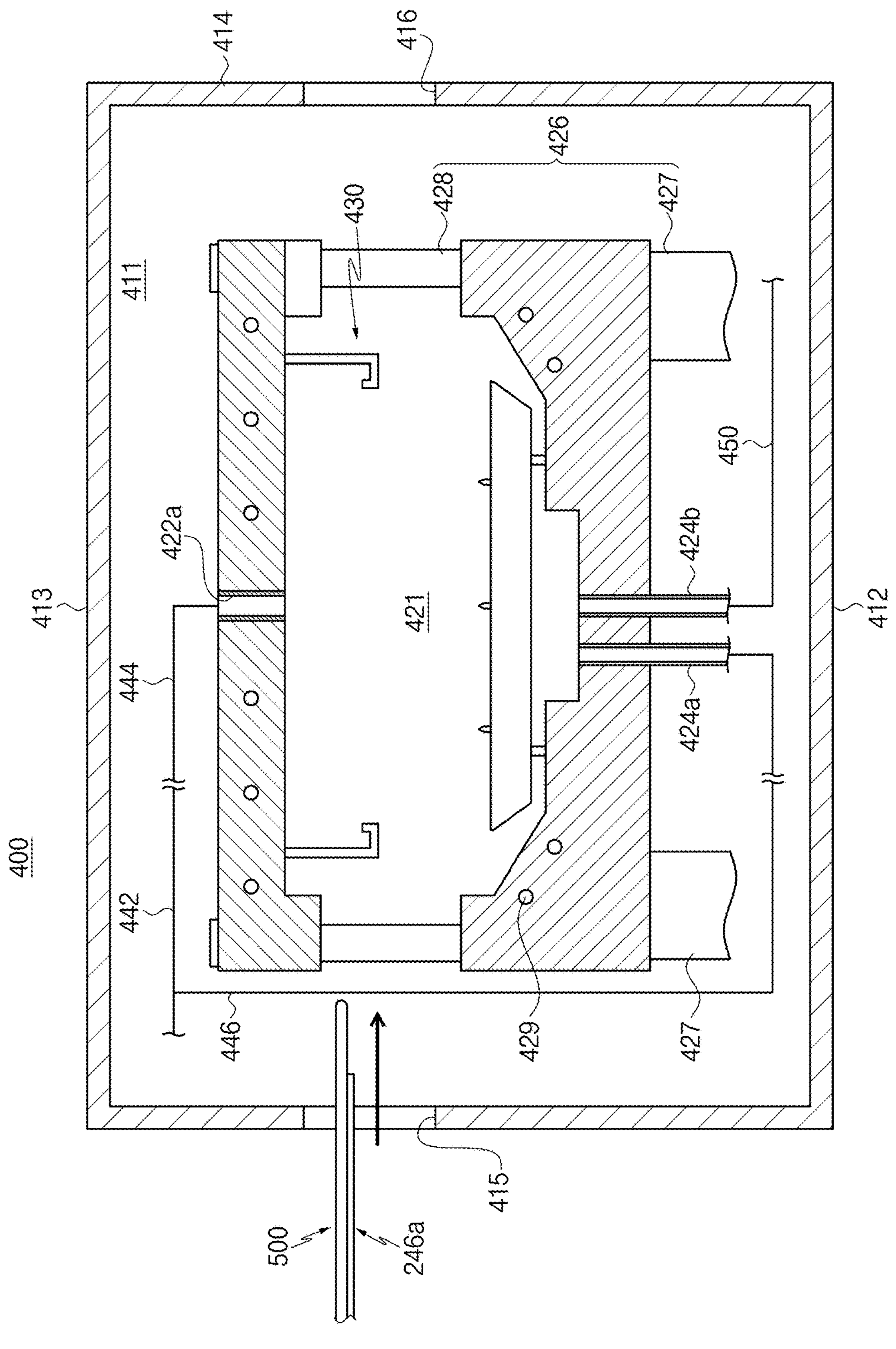
FIGS. 9 to 13 are diagrams schematically illustrating the interior of the drying chamber according to the exemplary embodiment of FIG. 3 while a chamber cleaning operation of FIG. 8 is being performed.

FIG. 9 is a diagram schematically illustrating a substrate carrier loading the heating unit into the interior of the drying chamber during the heating unit loading operation of FIG. 8.

Referring to FIG. 9, the substrate carrier 246*a* is in the state of supporting the heating unit 500. The substrate carrier 246*a* loads the heating unit 500 into the drying chamber 400 through the opening 415 formed in the lateral wall 414 of the drying chamber 400. At this time, the lower body 424 and the upper body 422 of the chamber body 420 are spaced apart so that the treatment space 421 is opened, and the heating unit 500 is loaded into the treatment space 421.

Figure 10:
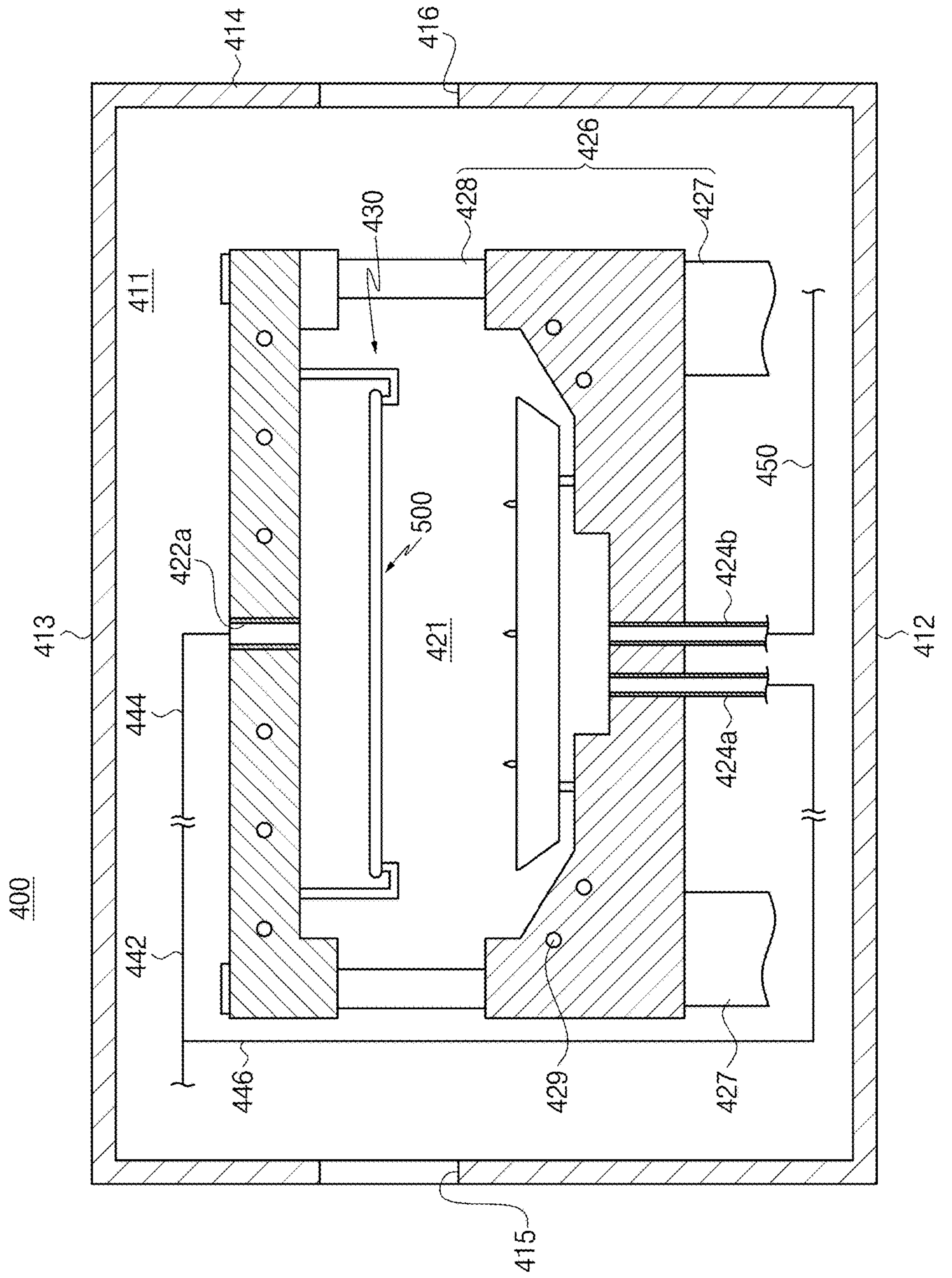
Figure 11:
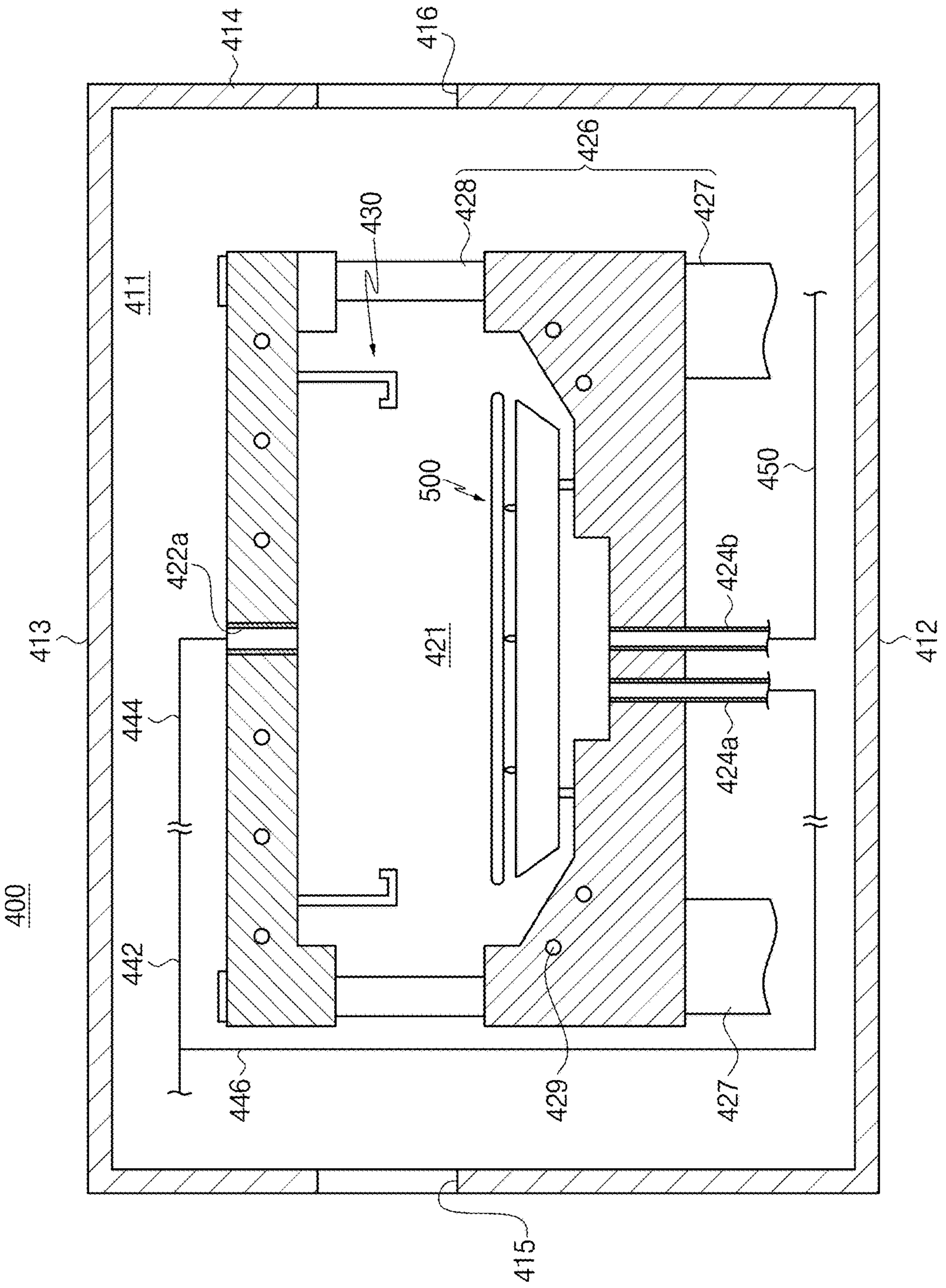
Figure 12:
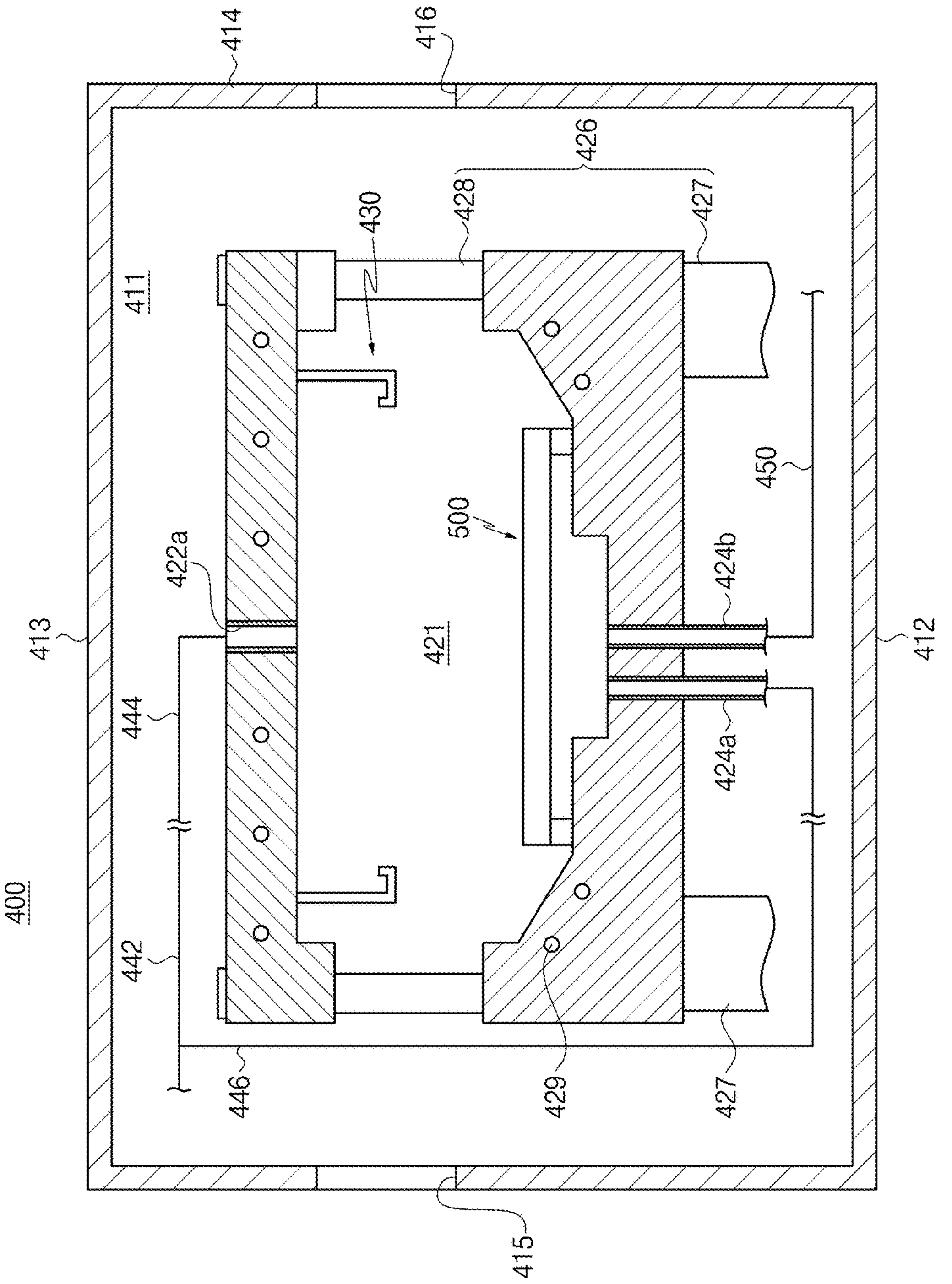

FIGS. 10 to 12 are diagrams schematically illustrating the interior of the drying chamber according to the exemplary embodiment of FIG. 3 while the chamber cleaning operation of FIG. 8 is being performed.

In the exemplary embodiment illustrated in FIG. 10, when the heating unit of FIGS. 5 and 6 is used, the heating unit 500 may be placed on the support unit 430 by the substrate carrier 246*a*, and the heating unit 500 may be supported by the support unit 430. When power is applied to the heating unit 500 by the power unit 530 included in the heating unit 500, the heater 520 heats the interior of the chamber body 420 to clean the chamber body 420.

Optionally, when the heating unit of FIGS. 5 and 6 is used, the heating unit 500 may be placed on the support pin 463 by the substrate carrier 246*a*, and the heating unit 500 may be supported by the support pin 463, as illustrated in the exemplary embodiment in FIG. 11. When power is applied to the heating unit 500 by the power unit 530 included in the heating unit 500, the heater 520 heats and cleans the interior of the chamber body 420.

In the exemplary embodiment illustrated in FIG. 12, the heating unit 500*b* according to FIG. 7 may be placed on the first bottom surface 425*b* of the chamber body 420 by an operator rather than by the substrate carrier 246*a*, and the base 510*b* of the heating unit 500*b* may be supported by the first bottom surface 425*b*. In this case, the filler member 460 is in the removed state. When power is applied to the heating unit 500 by the power unit 530 included in the heating unit 500, the heater 520 heats and cleans the interior of the chamber body 420.

Figure 13:
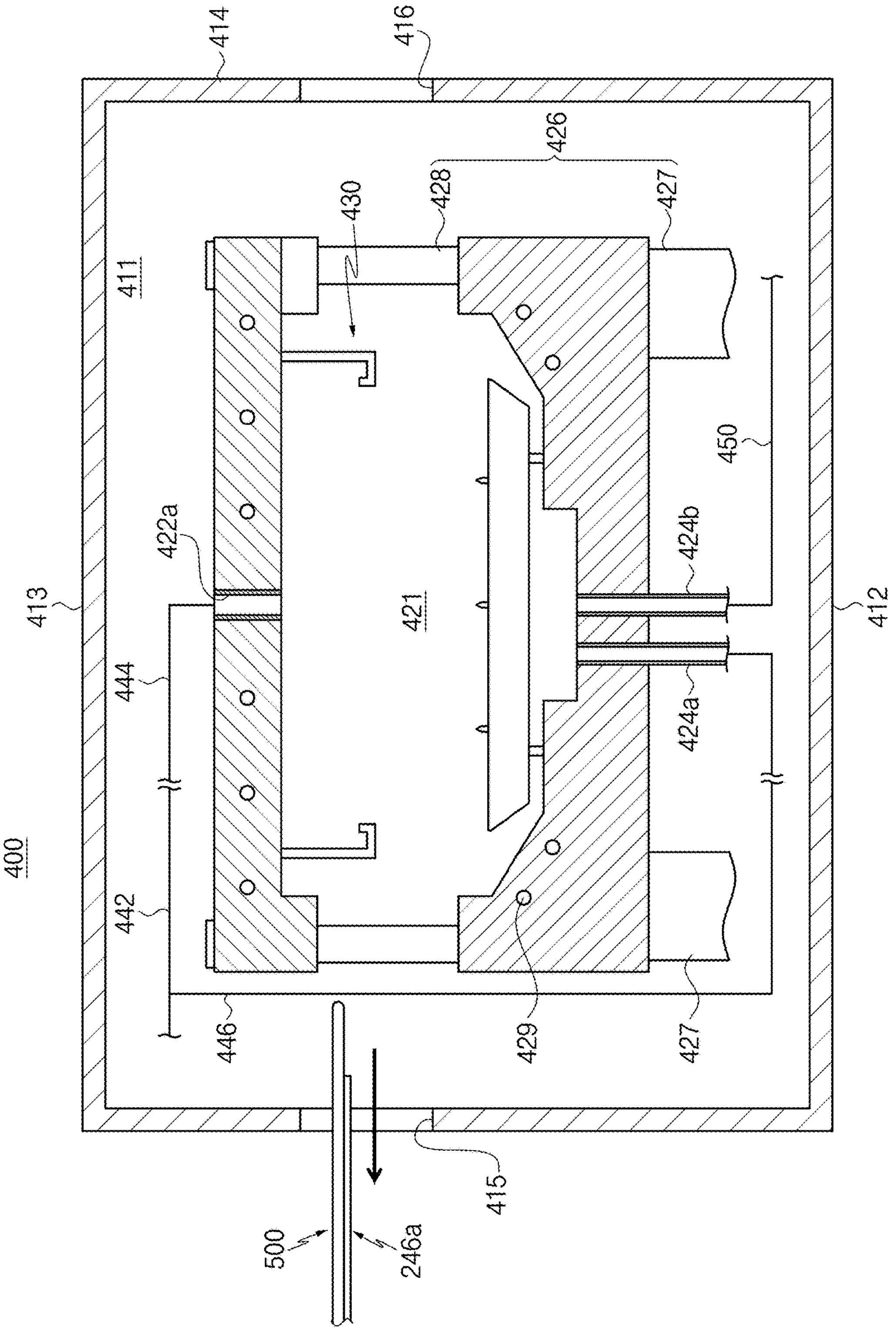

FIG. 13 is a diagram schematically illustrating the interior of the drying chamber during the heating unit unloading operation of FIG. 8.

Referring to FIG. 13, the substrate carrier 246*a* is unloaded from the interior of the drying chamber 400 through the opening 415 while supporting the heating unit 500.

FIGS. 10 to 12 illustrate the case where the chamber cleaning operation S22 is performed in the state where the lower body 424 and upper body 422 of the chamber body 420 are spaced apart and the treatment space 421 is opened, but the present invention is not limited thereto. The chamber cleaning operation S22 may also be performed in the state where the chamber body 420 is closed. In this case, the lower body 424 and the upper body 422 are in close contact and the treatment space 421 is sealed.

In the chamber cleaning operation S20, the atmosphere in the treatment space 421 is exhausted. When the chamber body 420 is opened, the exhaust is performed by the exhaust unit 416. When the chamber body 420 is closed, the exhaust is performed by the exhaust line 450 connected to the exhaust port 424*b*.

The exhaust unit 416 is provided in the lateral wall 414 of the housing 410. In one example, the exhaust unit 416 may be formed in the lateral wall 414 opposite to the lateral wall 414 in which the opening 415 is formed. The exhaust unit 416 exhausts the atmosphere of the interior space 411 of the housing 410 and the treatment space 421 of the body 420.

Referring again to FIG. 8, the chamber cleaning operation S20 may optionally proceed after a set number of substrates W is treated in the drying chamber 400. The chamber cleaning operation S20 may optionally proceed after each treatment of one substrate W in the drying chamber 400.

By performing the chamber cleaning operation S20, contamination inside the chamber body 420 of the drying chamber 400 and in the treatment space 421, for example, organic solvents that are not exhausted and remain in the treatment space 421, may be removed by heat. For example, the organic solvent may be isopropyl alcohol (IPA). By performing the chamber cleaning operation S20, the organic matter deposited or residual on the chamber body 420 may be removed. By performing the chamber cleaning operation S20, the drying chamber 400 and the chamber body 420 may be prevented from becoming contaminated, and the substrate W may be prevented from being back-contaminated by contamination of the chamber body 420 when performing the substrate treating operation S10. By performing the chamber cleaning operation S20, poor treatment of the substrate W may be prevented.

The chamber cleaning operation S20 may also be performed during maintenance of the substrate treating apparatus. When the chamber cleaning operation S20 is performed during maintenance, the heating unit 500 may be loaded into the chamber by an operator. When the chamber body 420 and the treatment space 421 are cleaned by supplying a cleaning solution to the chamber body 420 during maintenance, it takes a long time to stabilize the equipment due to waiting for the cleaning solution to dry even after the cleaning is finished. In addition, only the surface of the chamber body 420 may be dried and the cleaning solution that has penetrated deep into the chamber body 420 may not be completely dry, which may cause damage to the chamber body 420 during the substrate treating operation S10.

When the chamber cleaning operation S20 of the present invention is performed together with the maintenance, it may have the effect of reducing the time required to stabilize the chamber by eliminating the need to wait for the cleaning solution to dry.

In particular, when a light lamp is used as the heater 520, chamber cleaning may be performed by heating the interior of the chamber body 420 at a high temperature. Also, when a light lamp is used as the heater 520, the chamber cleaning may be performed for a short period of time, such as tens of seconds or minutes. Furthermore, the heater installed on the inner wall of the chamber may damage the chamber body. However, when a light lamp is loaded into the treatment space to heat the treatment space, damage to the chamber body 420 may be reduced because the surface inside the chamber body 420 is heated intensively.

FIGS. 10 to 12 illustrate the case where the chamber cleaning operation S22 is performed in the state where the heating unit 500 is placed inside the chamber body 420, but the present invention is not limited thereto. The heating unit 500 may perform the chamber cleaning S22 while being supported by the substrate carrier 246*a*. In this case, the substrate carrier 246*a* may perform the chamber cleaning S22 while moving in the treatment space 421 in the upper and lower directions and/or the left and right directions. When the substrate carrier 246*a* performs the chamber cleaning operation S22 while moving in the treatment space 421, the substrate carrier 246*a* may selectively clean specific points within the treatment space 421. Further, the cleaning time of a particular point inside the treatment space 421 may be adjusted to increase the efficiency of the chamber cleaning.

Figure 14:
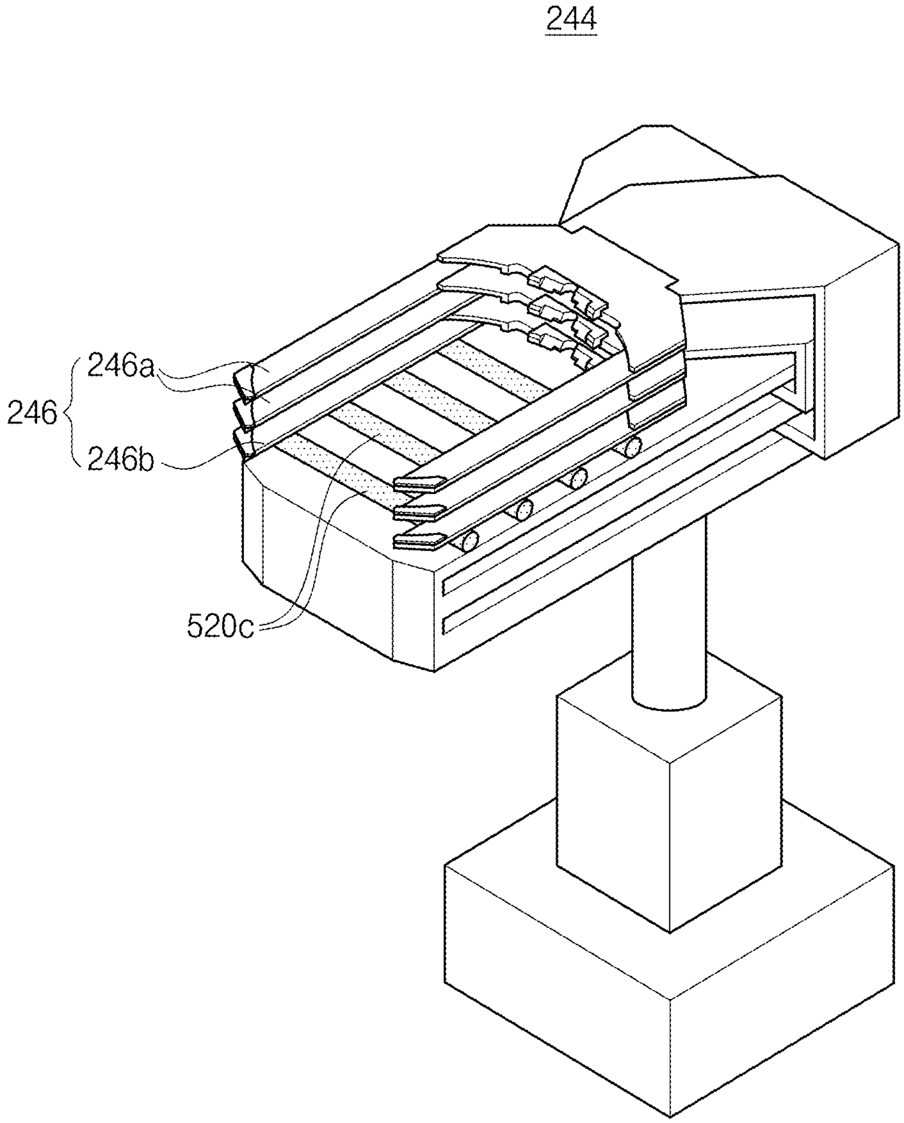
FIG. 14 is a perspective view illustrating another exemplary embodiment of the heating unit.

FIG. 14 is a perspective view illustrating another exemplary embodiment of the heating unit. Referring to FIG. 14, the heating unit may be provided in the state of being coupled to the transfer robot.

Referring to FIG. 14, the transfer unit 244 includes a substrate carrier 246*a* and a heating unit carrier 246*b*. The substrate carrier 246*a* and the heating unit carrier 246*b* are positioned to be spaced apart in the upper and lower directions. The heating unit carrier 246*b* is provided to move forwardly and backwardly independently of the substrate carrier 246*a*.

The heating unit carrier 246*b* is provided to be movable in the upper and lower directions or the left and right directions, and to be movable forwardly and backwardly.

Figure 15:
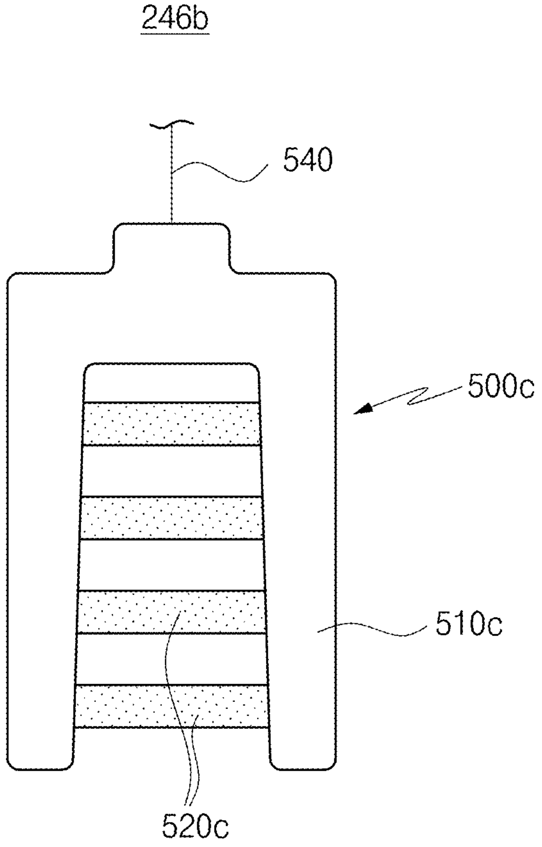
FIG. 15 is a top plan view of a heating unit carrier of FIG. 14.

FIG. 15 is a top plan view of the heating unit carrier of FIG. 14.

The heating unit carrier 246*b* is provided to which a heating unit 500*c* is coupled. The heating unit 500*c* includes a base 510*c*, one or more heaters 520*c*, and a power source 540. The bases 510*c* may be provided in the shape of two opposing rods. Between the two opposing bases 510*c*, the one or plurality of heaters 520*c* are installed. When power is applied to the heaters 520*c* via the power source 540, heat generated by the heaters 520*c* may be transferred in all directions.

Figure 16:
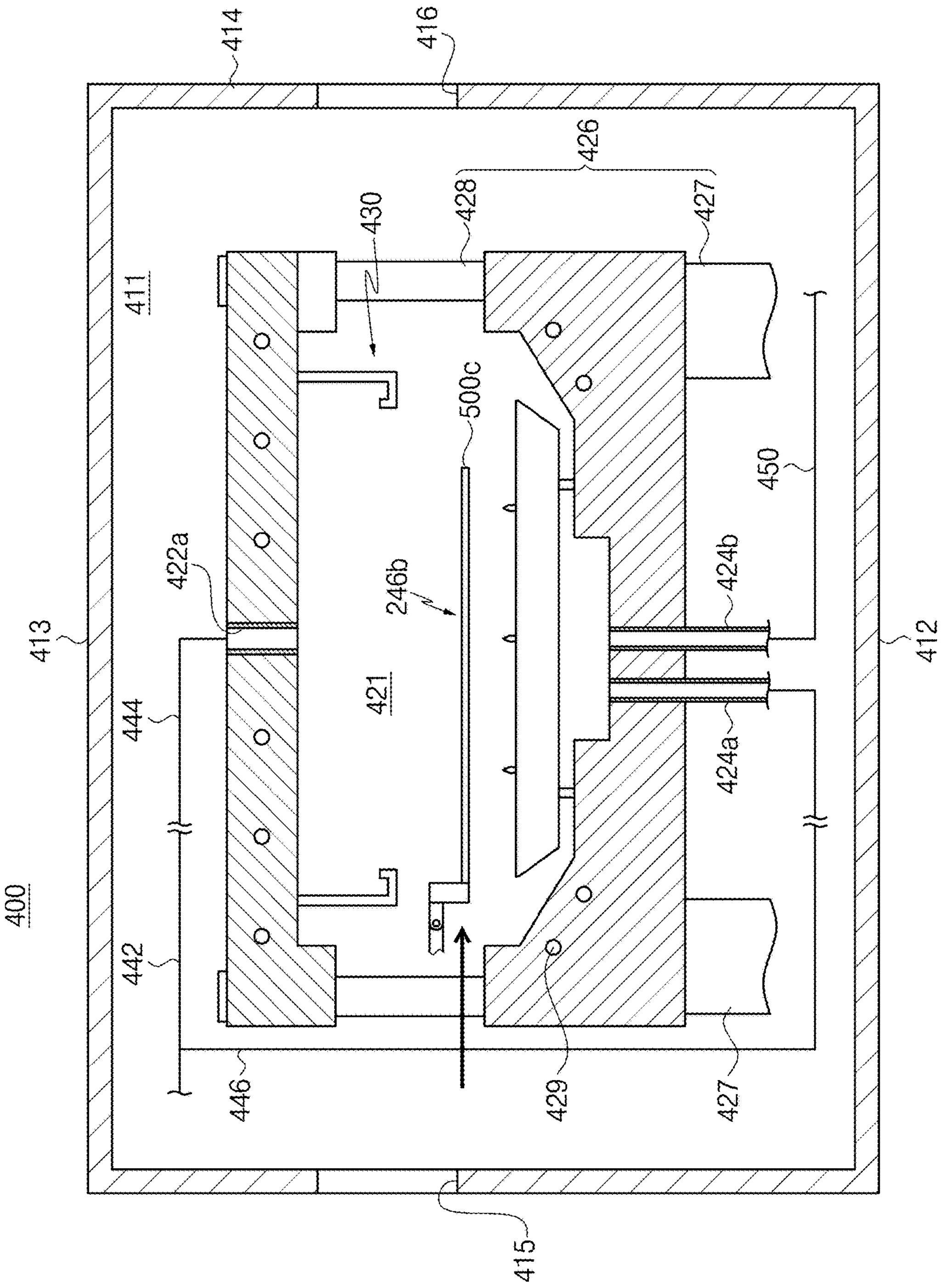
FIGS. 16 to 18 are diagrams illustrating an exemplary embodiment in which the heating unit carrier of FIG. 15 performs the chamber cleaning operation of FIG. 8.
Figure 17:
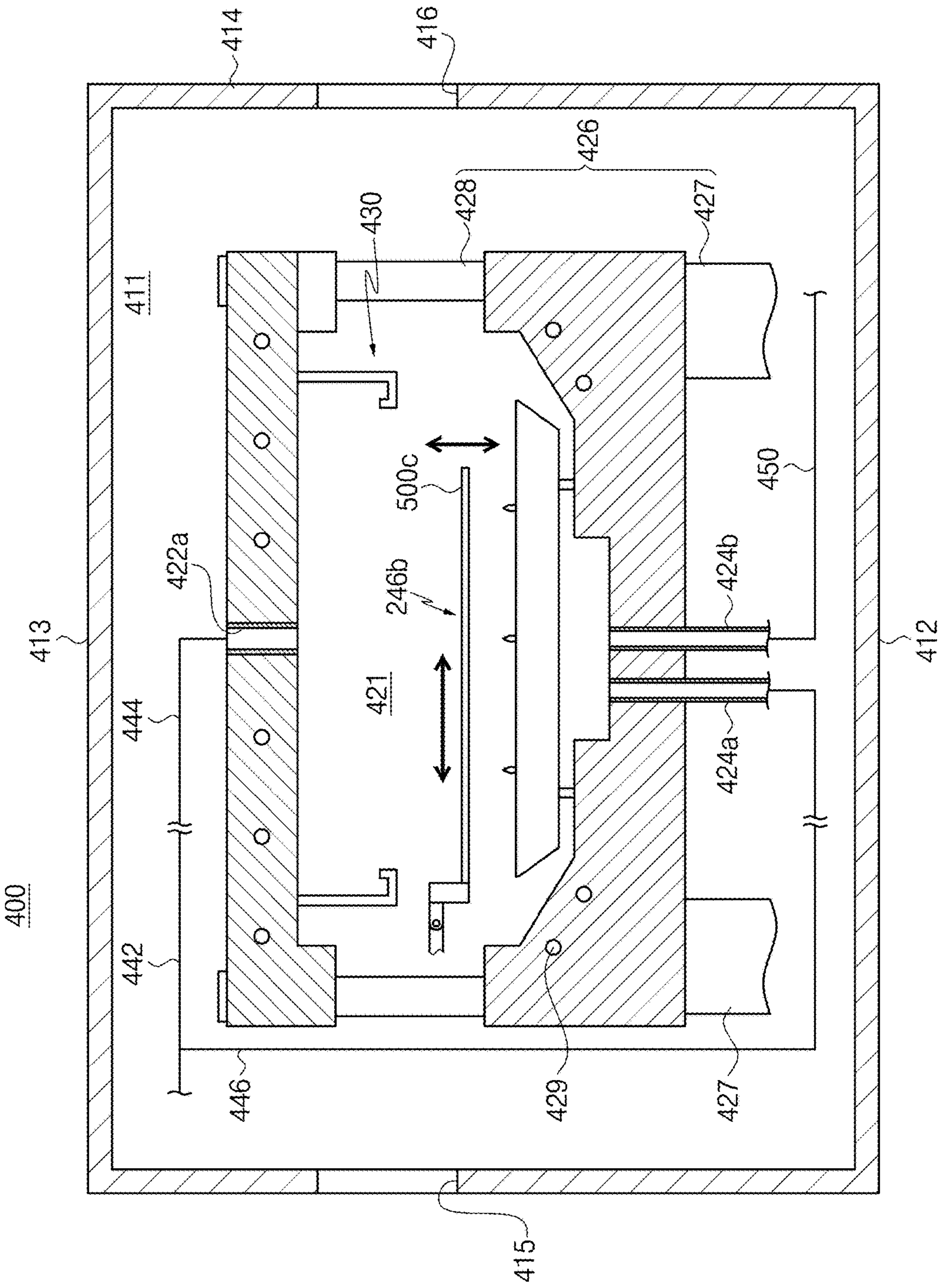
Figure 18:
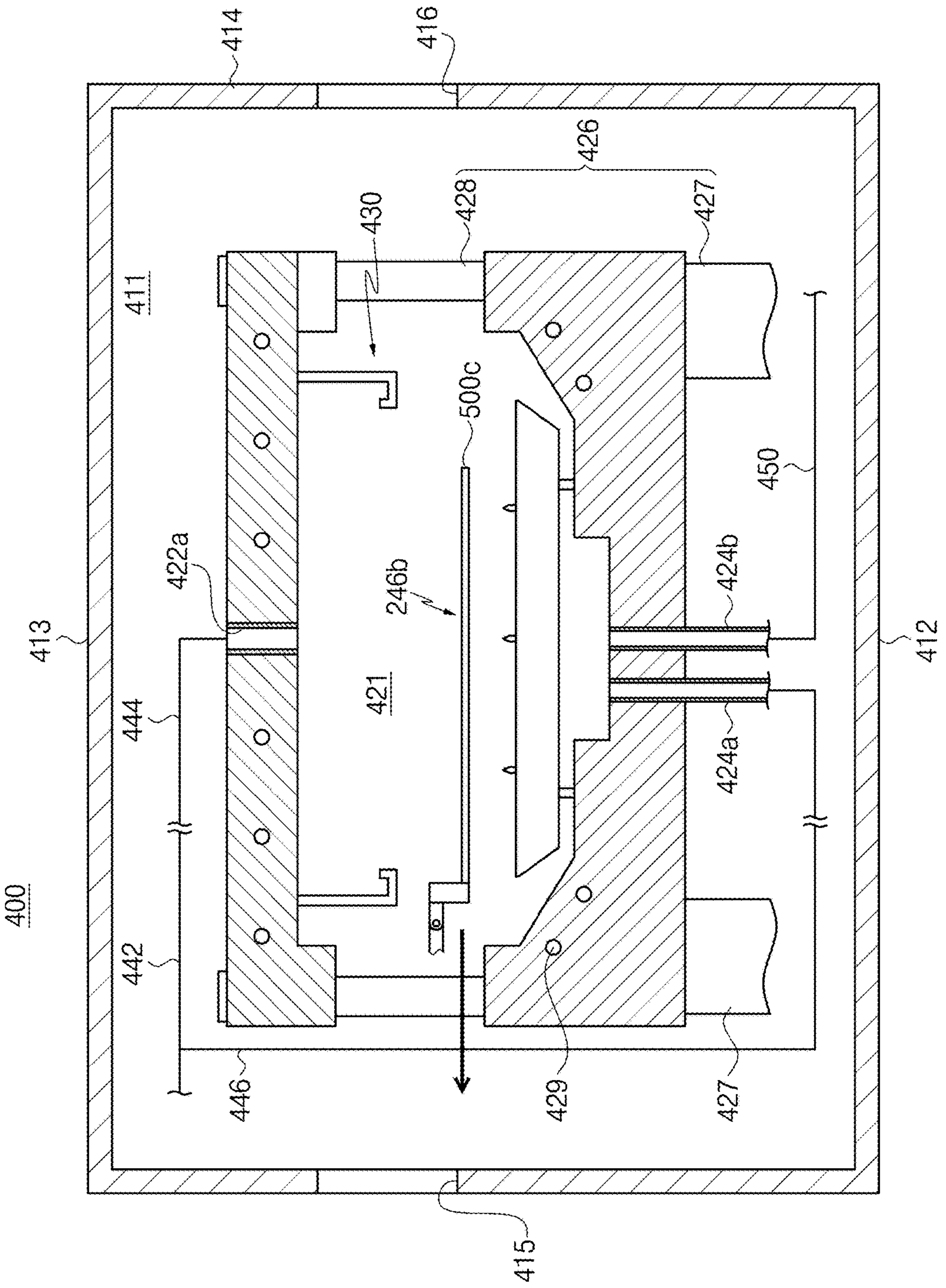

FIGS. 16 to 18 are diagrams illustrating an exemplary embodiment in which the heating unit carrier of FIG. 15 performs the chamber cleaning operation of FIG. 8.

FIG. 16 is a diagram schematically illustrating a view of the interior of the drying chamber according to the exemplary embodiment of FIG. 3 while the heating unit carrier of FIG. 15 is performing the heating unit loading operation of FIG. 8.

Referring to FIG. 16, the heating unit carrier 246*b* loads the heating unit 500*c* into the interior of the drying chamber 400 through the opening 415 formed in the lateral wall 414 of the drying chamber 400. The heating unit 500*c* is in the state of being coupled to the heating unit carrier 246*b*. In this case, the lower body 424 and upper body 422 of the chamber body 420 are spaced apart so that the treatment space 421 is opened, and the heating unit 500*c* is loaded into the treatment space 421.

FIG. 17 is a diagram schematically illustrating the heating unit carrier of FIG. 15 performing the chamber cleaning.

The heating unit 500*c* performs cleaning of the interior of the chamber body 420 while being coupled to the heating unit carrier 246*b*. When power is applied to the heating unit 500 by the power source 540 included in the heating unit 500*c* and the lead wire connected to the transfer unit 244, the heater 520*c* heats and cleans the interior of the chamber body 420. In this case, the heating unit carrier 246*b* may be moved in the up-and-down directions and/or the left and right directions to perform the cleaning.

FIG. 18 is a diagram schematically illustrating the interior of the drying chamber while the heating unit carrier of FIG. 15 is performing the heating unit unloading operation of FIG. 8.

Referring to FIG. 18, the heating unit carrier 246*b* is unloaded from the interior of the drying chamber 400 through the opening 415. The heating unit 500*c* is in the state of being coupled to the heating unit carrier 246*b*.

When the heating unit carrier **246*b* moves in the treatment space 421 to perform the chamber cleaning operation S22, the heating unit carrier 246*b* may selectively clean specific points inside the treatment space 421. Further, the cleaning time of a particular point inside the treatment space 421 may be adjusted to increase the efficiency of the chamber cleaning. Also, in the present exemplary embodiment, the process in which the substrate carrier 246*a* loads and unloads the heating unit 500 into and from the buffer unit 220 is required, but in the modified example, the heating unit carrier 246*b* is coupled to the heating unit 500*c***, so the loading and unloading processes may be omitted.

In the example above, the heating unit was described as being used to clean the chamber. However, unlike this, the cleaning may also be accomplished by providing a cleaning gas line to supply cleaning gas to the chamber, and supplying heated gas into the treatment space through the cleaning gas line.

It should be understood that exemplary embodiments are disclosed herein and that other variations may be possible. Individual elements or features of a particular exemplary embodiment are not generally limited to the particular exemplary embodiment, but are interchangeable and may be used in selected exemplary embodiments, where applicable, even if not specifically illustrated or described. The modifications are not to be considered as departing from the spirit and scope of the present invention, and all such modifications that would be obvious to one of ordinary skill in the art are intended to be included within the scope of the accompanying claims.

What is claimed is:

1. A substrate treating apparatus, comprising:

a treating chamber configured to treat a substrate;

a transfer unit configured to load and unload the substrate into and from a treatment space; and a heating unit configured to be loaded into and unloaded from the treatment space, the heating unit being configured to heat and clean the treatment space by heating, wherein the treating chamber includes:

a chamber body defining the treatment space; and a support configured to support the substrate within the treatment space; and a fluid supply configured to supply a fluid, which treats the substrate, in the treatment space, and the heating unit includes:

a base; and at least one first heater on a surface of the base, the support being configured to support the base; and a controller configured to control the transfer unit and the heating unit, the controller being configured to control the transfer unit and the heating unit to cause the heating unit to clean the treatment space in the state where the heating unit is supported on the support unit.

2. The substrate treating apparatus of claim 1, wherein the chamber body includes an upper body and a lower body, which are combined to define the treatment space, the support being in a shape configured to support an edge region of the substrate on the upper body, a filler under the support unit, the filler opposing the substrate when the substrate is on the support, a support pin on a top surface of the filler, and the support pin being configured to support the base.

3. The substrate treating apparatus of claim 1, wherein the transfer unit includes:

a hand configured to support the substrate and a substrate carrier, the substrate carrier being configured to couple to the hand, the substrate carrier being configured to provide forward and backward movement of the substrate; and a heating unit carrier configured to couple to the heating unit, the heating unit carrier being configured to provide forward and backward movement of the heating unit.

4. The substrate treating apparatus of claim 3, wherein the heating unit carrier and the substrate carrier are spaced apart in upper and lower directions.

5. The substrate treating apparatus of claim 4, wherein the at least one first heater includes a plurality of heaters, the base is coupled to the heating unit carrier, openings are defined by the base, the openings penetrating the base in the upper and lower directions, and each one of the plurality of heaters being in one of the openings.

6. The substrate treating apparatus of claim 2, further comprising:

a controller configured to control the transfer unit and the heating unit, wherein the controller is configured to cause the heating unit to clean the treatment space when the heating unit is supported on the support pin.

7. The substrate treating apparatus of claim 1, wherein the at least one first heater is a light emitting unit that emits light.

8. A substrate treating apparatus, comprising:

a treating chamber configured to treat a substrate;

a transfer unit configured to load and unload the substrate into and from a treatment space; and a heating unit configured to be loaded into and unloaded from the treatment space, the heating unit being configured to heat and clean the treatment space by heating, wherein the treating chamber includes:

a chamber body defining the treatment space; and a support configured to support the substrate within the treatment space; and a fluid supply configured to supply a fluid, which treats the substrate, in the treatment space, and the heating unit includes:

a base; and at least one first heater on a surface of the base, the heating unit being configured to be movable by the transfer unit, a controller configured to control the transfer unit and the heating unit, the controller being configured to control the transfer unit and the heating unit to clean the treatment space when the heating unit is in the transfer unit, and the controller being configured to control the transfer unit to change a position of the heating unit within the treatment space while the treatment space is being cleaned.

9. The substrate treating apparatus of claim 8, wherein the treating chamber includes:

a housing enclosing the chamber body, the housing including an inlet through which the substrate is loaded; and an exhaust configured to exhaust an outer region of the chamber body within the housing, and the chamber body including an upper body and a lower body which are combined to define the treatment space; and a driver configured to move the upper body or the lower body such that a relative position between the upper body and the lower body is changed, and the controller is configured to control the driver such that the treatment space is cleaned while the upper body and the lower body are spaced apart from each other and the chamber body is opened.

10. A substrate treating apparatus, comprising:

a treating chamber configured to remove organic solvents remaining on a substrate following exposure a supercritical fluid;

a transfer unit configured to load and unload the substrate into and from a treatment space, the treatment space being configured to treat the substrate; and a heating unit configured to be loaded into and unloaded from the treatment space, the heating unit being configured to heat and clean the treatment space by heating, wherein the treating chamber includes:

a chamber body defining the treatment space;

a support configured to support the substrate within the treatment space; and a fluid supply configured to supply the supercritical fluid to the treatment space, and the chamber body including an upper body and a lower body which are combined to define the treatment space;

a driver configured to move for the upper body or the lower body such that a relative position between the upper body and the lower body is changed, and the heating unit including a base; and at least one first heater on a surface of the base; and a controller configured to control the transfer unit and the heating unit, the controller being configured to cause the heating unit to clean the treatment space in the state when the heating unit is supported on the support.

11. The substrate treating apparatus of claim 10, further comprising:

a controller configured to control the transfer unit and the heating unit, wherein the support is in a shape configured to support an edge region of the substrate on the upper body, a filler under the support unit, the filler opposing the substrate when the substrate is on the support, a support pin on a top surface of the filler, and the controller being configured to control the transfer unit and the heating unit to clean the treatment space when the heating unit is supported on the support pin.

12. The substrate treating apparatus of claim 10, wherein the at least one first heater is a light emitting unit configured to emit light.

* * * * *